(12) United States Patent
Twieg

(10) Patent No.: US 11,796,613 B2
(45) Date of Patent: Oct. 24, 2023

(54) OPTO-ISOLATOR CIRCUITRY FOR MAGNETIC RESONANCE IMAGING APPLICATIONS

(71) Applicant: Hyperfine Operations, Inc., Guilford, CT (US)

(72) Inventor: Michael Twieg, New Haven, CT (US)

(73) Assignee: Hyperfine Operations, Inc., Guilford, CT (US)

( * ) Notice: Subject to any disclaimer, the term of this patent is extended or adjusted under 35 U.S.C. 154(b) by 0 days.

(21) Appl. No.: 17/549,441

(22) Filed: Dec. 13, 2021

(65) Prior Publication Data

US 2022/0187395 A1    Jun. 16, 2022

Related U.S. Application Data

(60) Provisional application No. 63/125,463, filed on Dec. 15, 2020.

(51) Int. Cl.
*G01R 33/36* (2006.01)

(52) U.S. Cl.
CPC ..... *G01R 33/3628* (2013.01); *G01R 33/3642* (2013.01); *G01R 33/3664* (2013.01)

(58) Field of Classification Search
CPC .............. G01R 33/543; G01R 33/5608; G01R 33/4828; G01R 33/3415; G01R 33/283;
(Continued)

(56) References Cited

U.S. PATENT DOCUMENTS 6,710,597 B2 * 3/2004 Reykowski ........ G01R 33/3657
324/318
8,749,237 B2    6/2014 Iannotti et al.
(Continued)

FOREIGN PATENT DOCUMENTS

WO    WO 2012/160518 A1    11/2012

OTHER PUBLICATIONS

Invitation to Pay Additional Fees for International Application No. PCT/US2021/063079 dated Mar. 23, 2022.
(Continued)

*Primary Examiner* — Jermele M Hollington
*Assistant Examiner* — Taqi R Nasir
(74) *Attorney, Agent, or Firm* — Foley & Lardner LLP

(57) ABSTRACT

The present disclosure provides techniques for using opto-isolator circuitry to control switching circuitry configured to be coupled to a radio-frequency (RF) coil of a magnetic resonance imaging (MRI) system. In some embodiments, opto-isolator circuitry described herein may be configured to galvanically isolate switch controllers of the MRI system from the switching circuitry and/or provide feedback across an isolation barrier. Some embodiments provide an apparatus including switching circuitry configured to be coupled to an RF coil of an MRI system and a drive circuit that includes opto-isolator circuitry configured to control the switching circuitry. Some embodiments provide an MRI system that includes an RF coil configured to, when operated, transmit and/or receive RF signals to and/or from a field of view of the MRI system, switching circuitry coupled to the RF coil, and a drive circuit that includes opto-isolator circuitry configured to control the switching circuitry.

20 Claims, 14 Drawing Sheets

(58) Field of Classification Search
CPC .. G01R 33/307; G01R 33/60; G01R 33/3628; G01R 33/3642; G01R 33/3664; G01V 3/32; E21B 49/08; E21B 2049/085; G01N 24/10
See application file for complete search history.

(56) References Cited

U.S. PATENT DOCUMENTS

| | | | | |
|---|---|---|---|---|
| 2012/0176135 | A1* | 7/2012 | Iannotti | H03K 17/785 324/318 |
| 2019/0353723 | A1* | 11/2019 | Dyvorne | G01R 33/341 |

OTHER PUBLICATIONS

International Search Report and Written Opinion for International Application No. PCT/US2021/063079 dated May 16, 2022.
Byron et al., A wireless power transfer system for MRI scanners. 2018 IEEE Wireless Power Transfer Conference (WPTC) Jun. 3, 2018. 4 pages.
Sappo et al., MEMS-based Ratio Adjustable Power Splitters for in-bore Switching of Transmit Array Compression Networks. Abstract. ISMRM 27th Annual Meeting & Exhibition, Montreal, Canada. May 2019. 2 pages. https://archive.ismrm.org/2019/1567.html [Last accessed May 23, 2022].
Twieg, Galvanically Isolated RF Switches for Low Field MRI. Proceedings of the 2021 ISMRM & SMRT Annual Meeting & Exhibition. May 2021. 4 pages.
Chen, iCoupler® Products with isoPower™M Technology: Signal and Power Transfer Across Isolation Barrier Using Microtransformers. INterface. 2006;1(C2):12mm. 4 pages.
Doherty et al., The PIN diode circuit designers' handbook. Microsemi Corporation. 1998;1:1-37. http://www.qsl.net/n9zia/pdf/pin_diode_handbook.pdf [Last accessed Mar. 18, 2022].
Edelstein et al., Electronic decoupling of surface-coil receivers for NMR imaging and spectroscopy. Journal of Magnetic Resonance (1969). Mar. 1, 1986;67(1):156-61.
Fuentes et al., Micro-Electromechanical Systems (MEMS) based RF-switches in MRI—a performance study. InProceedings of the 18th Annual Meeting of ISMRM, Stockholm, Sweden Jan. 1, 2010. 1 page. [Online]. Available: https://cds.ismrm.org/protected/10MProceedings/PDFfiles/422_4665.PDF.
Lu et al., Q-spoiling method using depletion mode Gallium Nitride (GaN) HEMT devices at 1.5 T. InProc Intl Soc Mag Reson Med 2015;23:855.
Spence et al., Custom MEMS switch for MR surface coil decoupling. InProceedings of the 23rd Annual Meeting of ISMRM, Toronto, Canada 2015 (p. 0704) . . . Available: https://cds.ismrm.org/protected/15MPresentations/abstracts/0704.pdf.
Twieg et al., Active detuning of MRI receive coils with GaN FETs. IEEE Transactions on Microwave Theory and Techniques. Nov. 12, 2015;63(12):4169-77.

* cited by examiner

OPTO-ISOLATOR CIRCUITRY FOR MAGNETIC RESONANCE IMAGING APPLICATIONS

RELATED APPLICATIONS

This application claims priority under 35 U.S.C. § 119(e) to U.S. Provisional Application Ser. No. 63/125,463, filed Dec. 15, 2020, and titled, "OPTO-ISOLATOR CIRCUITRY FOR MAGNETIC RESONANCE IMAGING APPLICATIONS," which is incorporated by reference in its entirety herein.

BACKGROUND

Magnetic resonance imaging (MRI) provides an important imaging modality for numerous applications and is widely utilized in clinical and research settings to produce images of the inside of the human body. MRI is based on detecting magnetic resonance (MR) signals, which are electromagnetic waves emitted by atoms in response to state changes resulting from applied electromagnetic fields. For example, nuclear magnetic resonance (NMR) techniques involve detecting MR signals emitted from the nuclei of excited atoms upon the re-alignment or relaxation of the nuclear spin of atoms in an object being imaged (e.g., atoms in the tissue of the human body). Detected MR signals may be processed to produce images, which in the context of medical applications allows for the investigation of internal structures and/or biological processes within the body for diagnostic, therapeutic, and/or research purposes.

SUMMARY

Some aspects of the present disclosure relate to a drive circuit configured to drive switching circuitry configured to be coupled to a radio-frequency (RF) coil of a magnetic resonance imaging (MRI) system, the drive circuit comprising opto-isolator circuitry configured to control the switching circuitry. In some embodiments, the MRI system is a low-field MRI system. In some embodiments, the RF coil is an RF transmit coil. In some embodiments, the opto-isolator circuitry comprises an isolated power supply and an isolated driver. In some embodiments, the isolated driver is configured to draw, from the isolated power supply, a quiescent current of less than 10 microamperes (μA).

In some embodiments, the isolated power supply is configured to receive a bias signal on a first side of an isolation barrier and generate a bias voltage on a second side of the isolation barrier based on the bias signal, and the isolated driver is configured to receive a control signal on the first side of the isolation barrier and control the switching circuitry on the second side of the isolation barrier based on the control signal. In some embodiments, the isolated power supply comprises a first isolation barrier portion of the isolation barrier and is configured to receive the bias signal on a first side of the first isolation barrier portion and generate the bias voltage on a second side of the first isolation barrier portion, and the isolated driver comprises a second isolation barrier portion of the isolation barrier and is configured to receive the control signal on a first side of the second isolation barrier portion and control the switching circuitry on a second side of the second isolation barrier portion.

In some embodiments, the drive circuit further comprises a capacitor coupled to the isolated power supply, wherein the isolated power supply is configured to maintain the bias voltage across the capacitor when the isolated driver controls the switching circuitry using the bias voltage. In some embodiments, the isolated power supply comprises a photovoltaic isolator (PVI). In some embodiments, the isolated driver comprises at least one phototransistor. In some embodiments, the at least one phototransistor comprises a first phototransistor configured to couple the bias voltage from the isolated power supply to the switching circuitry and a second phototransistor configured to discharge the bias voltage from the switching circuitry. In some embodiments, the first phototransistor is configured to receive the control signal and the second phototransistor is configured to receive an inverted version of the control signal.

In some embodiments, the opto-isolator circuitry further comprises feedback circuitry configured to generate a feedback signal on a first side of an isolation barrier based on a sense signal on a second side of the isolation barrier, and the switching circuitry is positioned on the second side of the isolation barrier. In some embodiments, the feedback circuitry comprises a sense component positioned on the second side of the isolation barrier and configured to generate the sense signal and a feedback phototransistor configured to receive the sense signal on the second side of the isolation barrier and generate the feedback signal on the first side of the isolation barrier based on the sense signal. In some embodiments the opto-isolator circuitry comprises an isolated power supply configured to receive a bias signal on the first side of the isolation barrier and generate a bias voltage on the second side of the isolation barrier based on the bias signal, and wherein the sense component is configured to generate the sense signal based on the bias voltage. In some embodiments, the sense component comprises a Zener diode.

In some embodiments, the switching circuitry comprises a first switch and a second switch coupled in an anti-series configuration. In some embodiments, the opto-isolator circuitry is configured to be coupled to first and second control terminals of the first and second switches, respectively. In some embodiments, the first and second switches comprise field effect transistors (FETs). In some embodiments, the first and second switches comprise gallium nitride (GaN) FETs. In some embodiments, the opto-isolator circuitry is configured to change a state of the switching circuitry in less than 100 microseconds. In some embodiments, the opto-isolator circuitry is configured to change the state of the switching circuitry in less than 50 microseconds. In some embodiments, the opto-isolator circuitry is configured to change the state of the switching circuitry in less than 10 microseconds.

In some embodiments, the drive circuit does not comprise ferromagnetic materials. In some embodiments, the drive circuit does not comprise a transformer.

Some aspects of the present disclosure relate to a method comprising controlling switching circuitry coupled to a radio-frequency (RF) coil of a magnetic resonance imaging (MRI) system at least in part using opto-isolator circuitry. In some embodiments, the MRI system is a low-field MRI system. In some embodiments, the RF coil is an RF transmit coil.

In some embodiments, the opto-isolator circuitry comprises an isolated power supply and an isolated driver, controlling the switching circuitry comprises receiving a bias signal at the isolated power supply on a first side of an isolation barrier, generating a bias voltage on a second side of the isolation barrier based on the bias signal, and receiving a control signal at the isolated driver on the first side of the isolation barrier, and the isolated driver controls the switching circuitry on the second side of the isolation barrier based on the control signal. In some embodiments, the isolated power supply comprises a first isolation barrier portion of the isolation barrier, receives the bias signal on a first side of the first isolation barrier portion, and generates the bias voltage on a second side of the first isolation barrier portion, and the isolated driver comprises a second isolation barrier portion of the isolation barrier, receives the control signal on a first side of the second isolation barrier portion, and controls the switching circuitry on a second side of the second isolation barrier portion.

In some embodiments, the method further comprises drawing, by the isolated driver, from the isolated power supply, a quiescent current of less than 10 microamperes (µA). In some embodiments, controlling the switching circuitry comprises maintaining the bias voltage across a capacitor coupled to the isolated power supply when the isolated driver controls the switching circuitry using the bias voltage. In some embodiments, the isolated power supply comprises a photovoltaic isolator (PVI). In some embodiments, the isolated driver comprises at least one phototransistor. In some embodiments, controlling the switching circuitry further comprises coupling the bias voltage from the isolated power supply to the switching circuitry using a first phototransistor and discharging the bias voltage from the switching circuitry using a second phototransistor. In some embodiments, controlling the switching circuitry further comprises receiving the control signal at the first phototransistor and receiving an inverted version of the control signal at the second phototransistor.

In some embodiments, the method further comprises generating a feedback signal on a first side of an isolation barrier based on a sense signal on a second side of the isolation barrier, and the switching circuitry is positioned on the second side of the isolation barrier. In some embodiments, generating the feedback signal comprises receiving the sense signal at a feedback phototransistor on the second side of the isolation barrier, and the feedback phototransistor generates the feedback signal on the first side of the isolation barrier based on the sense signal. In some embodiments, the method further comprises generating the sense signal based on a bias voltage of an isolated power supply, wherein the isolated power supply generates the bias voltage on the second side of the isolation barrier based on a bias signal received at the isolated power supply on the first side of the isolation barrier. In some embodiments, the sense signal is generated using a Zener diode.

In some embodiments, the switching circuitry comprises a first switch and a second switch coupled in an anti-series configuration. In some embodiments, the first and second switches comprise field effect transistors (FETs). In some embodiments, the first and second switches comprise gallium nitride (GaN) FETs. In some embodiments, controlling the switching circuitry comprises changing a state of the switching circuitry in less than 100 microseconds. In some embodiments, controlling the switching circuitry comprises changing the state of the switching circuitry in less than 50 microseconds. In some embodiments, controlling the switching circuitry comprises changing the state of the switching circuitry in less than 10 microseconds.

In some embodiments, controlling the switching circuitry comprises using a drive circuit that does not comprise ferromagnetic materials. In some embodiments, controlling the switching circuitry comprises using a drive circuit that does not comprise a transformer.

Some aspects of the present disclosure relate to an apparatus comprising switching circuitry configured to be coupled to a radio-frequency (RF) coil of a magnetic resonance imaging (MRI) system and a drive circuit comprising opto-isolator circuitry configured to control the switching circuitry.

Some aspects of the present disclosure relate to a magnetic resonance imaging (MRI) system comprising a radio-frequency (RF) coil configured to, when operated, transmit and/or receive RF signals to and/or from a field of view of the MRI system, switching circuitry coupled to the RF transmit coil, and a drive circuit comprising opto-isolator circuitry configured to control the switching circuitry.

It should be appreciated that all combinations of the foregoing concepts and additional concepts described in greater detail below are contemplated as being part of the inventive subject matter disclosed herein. In particular, all combinations of claimed subject matter appearing at the end of this disclosure are contemplated as being part of the inventive subject matter disclosed herein.

BRIEF DESCRIPTION OF DRAWINGS

Various aspects and embodiments of the disclosed technology will be described with reference to the following figures. It should be appreciated that the figures are not necessarily drawn to scale.

DETAILED DESCRIPTION

Figure 1:
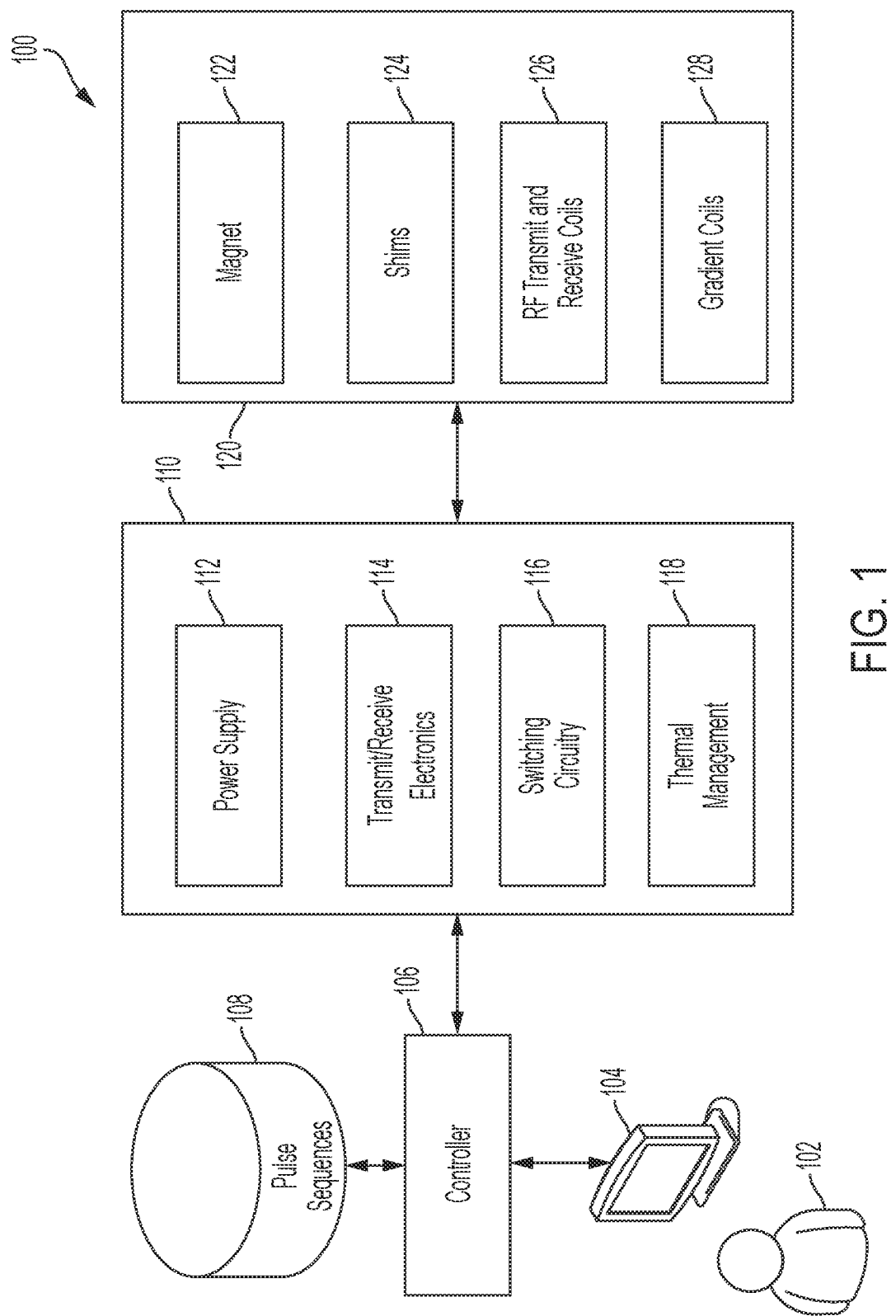
FIG. 1 is a drawing of an illustrative magnetic resonance imaging (MRI) system 100, in accordance with some embodiments of the technology described herein.

An MRI system typically transmits and receives signals at radio-frequencies (RF) using one or more RF coils. The MRI system may also include switching circuitry coupled to and configured to control the RF coil(s) such as by tuning and detuning the RF coil(s) and/or coupling and decoupling the RF coil(s) to and from transmit and receive circuitry of the MRI system. The switching circuitry may be controlled, in turn, by a controller of the MRI system via a drive circuit.

The inventors have recognized that the switching circuitry may be exposed to high voltage as a result of interacting with MR signals bound for or received from the RF coil(s), and it is desirable to isolate the controller from the high voltage using an isolated drive circuit. However, conventional isolated drive circuits are transformer-based and rely on the use of ferromagnetic materials that interfere with magnetic fields in their environment, making conventional isolated drive circuits unsuitable for use in MRI systems, where it is desirable to produce a homogenous $B_0$ magnetic field. Moreover, conventional isolated drive circuits require transformer-based power supplies with high frequency switching circuits (e.g., on the order of 1 kilohertz (kHz) or 1 megahertz (MHz)) that generate electromagnetic interference, which could contaminate the RF receive electronics of an MRI system.

To address this problem, the inventors developed drive circuits including opto-isolator circuitry configured to control switching circuitry (e.g., one or more RF switches) coupled to an RF coil of an MRI system. Drive circuits described herein can be configured to control switching circuitry of an MRI system while providing galvanic isolation between switching circuitry and switch controllers and are suitable for use in various MRI applications due to including little to no ferromagnetic material or transformer-based switching power converters. In particular, RF switches may be employed in various configurations within an MRI system and the drive circuits developed by the inventors can be used employed in numerous such configurations.

One example of the use of RF switching circuitry in MRI involves using, during a transmit period, one or more RF switches to couple RF transmit circuitry of the MRI system to an RF coil and/or to decouple RF receive circuitry of the MRI system from the RF coil. Similarly, in this example, the RF switch(es) may be configured to couple the RF receive circuitry to the RF coil and decouple the RF transmit circuitry from the RF coil. As another example, one or more RF switches may be configured to tune (e.g., to a particular frequency band and/or to impedance match) an RF transmit coil during the transmit period and one or more RF switches may be configured to tune an RF receive coil during the receive period. In yet another example, one or more RF switches may be configured to detune (e.g., spoil or damp) the RF receive coil during the transmit period and one or more RF switches may be configured to detune the RF transmit coil during the receive period. Detuning RF transmit coils during RF signal reception and detuning RF receive coils during RF signal transmission reduces coupling between the RF transmit coils and the RF receive coils during the transmit and receive periods, which would otherwise result in interference, thereby degrading the quality of images produced by the MRI system. The drive circuits developed by the inventors may be used in any of these MRI applications.

Conventional MRI systems employ drive circuits configured to control an RF switch by applying a DC bias (e.g., voltage and/or current) to the RF switch based on a control signal received from a switch controller. For example, the RF switch may enter a conductive or nonconductive state depending on the applied DC bias, thereby determining whether RF signals received at the RF switch are transmitted through or isolated by the channel of the RF switch. When an RF switch is implemented using a PIN diode, the drive circuit may apply a DC bias voltage across the terminals of the diode to control the diode. In some embodiments, MRI systems described herein may implement RF switches using three terminal switches, such as field effect transistors (FETs). When an RF switch is implemented as a FET, a drive circuit may apply a DC bias voltage and/or current to a control terminal of the FET to control the FET. An RF switch may be in a nonconductive state when a DC bias applied to the RF switch is less than a threshold bias condition (e.g., threshold voltage and/or current) of the RF switch, and an RF switch may be in a conductive state when a DC bias applied to the RF switch is greater than or equal to the threshold bias condition.

The inventors have recognized that it is desirable to galvanically isolate the RF switches from the switch controller, as the voltage level at the RF switches is typically much higher than the voltage level at the switch controller, and exposing the switch controller to the higher voltage level of the RF switches could harm the switch controller. However, the inventors also recognized that conventional isolated drive circuits are not suitable for use in MRI systems. For example, conventional transformer-based isolated drive circuits require isolated power supplies to bias the isolated drive circuits. Since conventional isolated drive circuits require quiescent power on the level of milliwatts, the conventional implementation of such an isolated power supply is a small switch-mode direct current (DC) to DC converter based on a power transformer. Such an implementation is unsuitable for MRI applications. First, power transformers are normally implemented using ferrite or iron cores, which would disturb the homogenous $B_0$ field required by an MRI system. Moreover, the transformer circuit of a DC to DC converter needs to operate at a high switching frequency, which can radiate electromagnetic fields from the power transformer at the high switching frequency and/or harmonic frequencies thereof, and the radiated electromagnetic fields from the transformer circuit may contaminate the sensitive receiver electronics of an MRI system.

To address these problems, the inventors have developed drive circuits including opto-isolator circuitry suitable for use in MRI systems. Opto-isolator circuitry may include one or more optical isolators having a galvanic isolation barrier and one or more components configured to receive an electrical signal on one side of the isolation barrier and transmit an optical signal across the isolation barrier based on the electrical signal. Drive circuits described herein may not include transformers or ferromagnetic materials. For example, opto-isolator circuitry described herein may include an isolated power supply that includes one or more photovoltaic isolators (PVIs) and an isolated driver including one or more phototransistors. In this example, the isolated power supply and isolated driver do not include ferromagnetic materials or transformer-based switching power converters. Thus, by employing opto-isolator circuitry described herein in a drive circuit, switching circuitry can be galvanically isolated from a switch controller without using ferromagnetic materials or transformer-based switching power supplies in the drive circuit that would otherwise interfere with operation of the MRI system. Such drive circuits may be included an MRI system because they would neither affect (e.g., homogeneity of) the $B_0$ magnetic field nor contaminate the RF receive electronics of the MRI system with electromagnetic interference radiated via a transformer.

Some embodiments of the technology described herein provide a drive circuit configured to drive switching circuitry configured to be coupled to an RF coil of an MRI system, the drive circuit comprising opto-isolator circuitry configured to control the switching circuitry. For example, the switching circuitry may be configured to control the RF coil, such as by detuning (e.g., damping or spoiling) and/or tuning the RF coil, and/or coupling or decoupling the RF coil to or from transmit circuitry or receive circuitry of the MRI system.

Moreover, the inventors recognized that some types of opto-isolator circuitry, such as a PVI, typically cannot control (e.g., turn on or turn off) an RF switch fast enough for use in some MRI applications, such as for controlling an RF transmit coil. For example, a conventional PVI may only be able to provide 10 microamps (μA) of bias current to the control terminal of a FET. Power FETs suitable to control an RF transmit coil typically have high gate capacitance, such as on the order of several nanocoulombs, which a PVI providing 10 μA of bias current requires 100 microseconds (μs) per nanocoulomb to charge, making PVIs too slow for use in controlling an RF transmit coil. While transformer-based isolated drive circuits typically employ switching power supplies capable of quickly controlling FETs having high gate capacitance, as discussed above, switching power supplies are not suitable for use in an MRI system because they employ ferromagnetic materials that would affect the $B_0$ magnetic field of the MRI system and would also contaminate the RF receive electronics of the MRI system with electromagnetic interference radiated by the transformer due to the switching operation of the power supply.

To make drive circuits described herein suitable for a wider range of MRI applications, in some embodiments, opto-isolator circuitry of a drive circuit may include an isolated power supply and an isolated driver configured for faster switching circuitry control than the isolated power supply alone. For example, in some embodiments, the isolated driver may be configured to draw, from the isolated power supply, a quiescent current of less than 10 μA. Quiescent current may be an amount of current drawn by a device when the device is not in transition between states. For example, a transistor draws quiescent current when the transistor is in a fully on or fully off state. An isolated driver configured to draw less than 10 μA of quiescent current is advantageous because the isolated driver may then be configured to draw high peak current from the isolated power supply to quickly control an RF switch (e.g., to charge gate capacitance) while, on average, only drawing an amount of current that the isolated power supply can provide. Thus, opto-isolator circuitry described herein can be used even for high current draw applications such as to control an RF transmit coil. In some embodiments, the opto-isolator circuitry may be configured to change the state of the switching circuitry in less than 100 μs. In some embodiments, the opto-isolator circuitry may be configured to change the state of the switching circuitry in less than 50 μs. In some embodiments, the opto-isolator circuitry may be configured to change the state of the switching circuitry in less than 10 μs. In some embodiments, the opto-isolator circuitry may be configured to change a state of the switching circuitry in less than 5 μs.

In some embodiments, the isolated power supply may be configured to receive a bias signal on a first side of an isolation barrier and generate a bias voltage on a second side of the isolation barrier based on the bias signal, and the isolated driver may be configured to receive a control signal on the first side of the isolation barrier and control the switching circuitry on the second side of the isolation barrier based on the control signal. For example, the isolated power supply may be configured to receive the bias signal from the switch controller on the first side and the isolated driver may be configured to receive the control signal on the first side. In some embodiments, the isolated driver may be configured to control the switching circuitry by coupling and/or decoupling a control terminal of the switching circuitry (e.g., of one or more FETs) to or from ground.

In some embodiments, the drive circuit may include a capacitor coupled to the isolated power supply, and the isolated power supply may be configured to maintain the bias voltage across the capacitor as the isolated driver controls the switching circuitry using the bias voltage. For example, the isolated power supply may be configured to apply a constant bias voltage to the terminals of the capacitor to maintain the bias voltage across the capacitor, and the isolated driver may be configured to couple the switching circuitry to the capacitor to turn the switching circuitry on (or off) and decouple the switching circuitry from the capacitor and couple the switching circuitry to ground to turn the switching circuitry off (or on).

In some embodiments, the isolated power supply may include a PVI and the isolated driver may include one or more phototransistors. In some embodiments, a first phototransistor may be configured to couple the bias voltage from the PVI to the switching circuitry and a second phototransistor may be configured to discharge the bias voltage from the switching circuitry. For example, the first phototransistor may be coupled between a control terminal of the switching circuitry and the bias voltage, and the second phototransistor may be coupled between the control terminal and ground. In some embodiments, the first phototransistor may be configured to receive a first version of the control signal and the second phototransistor may be configured to receive a second version of the control signal, and the second version may be an inverted version of the first version. For example, the first phototransistor may turn on in response to the first version of the control signal when the second phototransistor turns off in response to the second version of the control signal, and/or vice versa.

In some embodiments, opto-isolator circuitry of a drive circuit described herein may be alternatively or additionally configured to provide isolated feedback across an isolation barrier. In some embodiments, the opto-isolator circuitry may include feedback circuitry configured to generate a feedback signal on a first side of the isolation barrier based on a sense signal on a second side of the isolation barrier, and the switching circuitry may be positioned on the second side of the isolation barrier. For example, the sense signal may be indicative of an operating condition of the opto-isolator circuitry on the second side of the isolation barrier, and the feedback signal provide an indication of the sense signal on the first side of the isolation barrier.

In some embodiments, the feedback circuitry may include a sense component positioned on the second side of the isolation barrier and configured to generate the sense signal and a feedback phototransistor configured to receive the sense signal on the second side of the isolation barrier and generate the feedback signal on the first side of the isolation barrier based on the sense signal. For example, the feedback phototransistor may generate the feedback signal on the first side based on a sense current flowing through the feedback phototransistor and/or a sense voltage applied across the channel of the feedback phototransistor on the second side. In some embodiments, the sense component may be configured to generate the sense signal based on the bias voltage generated by the isolated power supply. For example, the feedback signal on the first side of the isolation barrier may provide an indication of a level of the bias voltage on the second side of the isolation barrier. In some embodiments, the sense component may include a Zener diode. For example, the Zener diode be coupled in series with the feedback phototransistor with the bias voltage applied across the series-coupled Zener diode and feedback transistor, and the sense signal may include a voltage across the feedback phototransistor that indicates a level of the bias voltage.

In some embodiments, the switching circuitry may include a first switch and a second switch coupled in an anti-series configuration. For example, the first and second switches may be coupled in series with opposite facing polarities, such that the first and second switches are configured to block current from flowing in the direction of either polarity. In this example, the first switch may be configured to block current from flowing through the first switch in a first direction when the first switch is in a non-conductive state and the second switch may be configured to block current from flowing through the second switch in a second direction opposite the first direction when the second switch is in a non-conductive state. In some embodiments, the opto-isolator circuitry may be configured to be coupled to first and second control terminals of the first and second switches, respectively. For example, the opto-isolator circuitry may be configured to apply a same voltage and/or current to the first and second control terminals that causes the first and second switches to be in conductive or nonconductive states at the same time. In some embodiments, the first and second switches may include one or more FETs. In some embodiments, the first and second switches may include one or more Gallium Nitride (GaN) FETs.

The technology described herein also includes methods, apparatuses, and MRI systems implementing one or more drive circuit techniques described herein. Some embodiments of the technology described herein provide a method including controlling switching circuitry coupled to an RF coil of an MRI system at least in part using opto-isolator circuitry. Some embodiments of the technology described herein provide an apparatus including switching circuitry configured to be coupled to an RF coil of an MRI system and a drive circuit that includes opto-isolator circuitry configured to control the switching circuitry. Some embodiments of the technology described herein provide an MRI system including an RF coil configured to, when operated, transmit and/or receive RF signals to and/or from a field of view of the MRI system, switching circuitry coupled to the RF coil, and a drive circuit that includes opto-isolator circuitry configured to control the switching circuitry.

In some embodiments, MRI systems described herein may be low-field MRI systems. As used herein, "high-field" refers generally to MRI systems presently in use in a clinical setting and, more particularly, to MRI systems operating with a main magnetic field (i.e., a $B_0$ field) at or above 1.5 T, though clinical systems operating between 0.5 T and 1.5 T are often also characterized as "high-field." Field strengths between approximately 0.2 T and 0.5 T have been characterized as "mid-field" and, as field strengths in the high-field regime have continued to increase, field strengths in the range between 0.5 T and 1 T have also been characterized as mid-field. By contrast, "low-field" refers generally to MRI systems operating with a $B_0$ field of less than or equal to approximately 0.2 T, though systems having a $B_0$ field of between 0.2 T and approximately 0.3 T have sometimes been characterized as low-field as a consequence of increased field strengths at the high end of the high-field regime. Within the low-field regime, low-field MRI systems operating with a $B_0$ field of less than 0.1 T are referred to herein as "very low-field" and low-field MRI systems operating with a $B_0$ field of less than 10 mT are referred to herein as "ultra-low field."

It should be appreciated that various embodiments of the technology described herein may be implemented in any number of ways. Examples of specific implementations are provided herein for illustrative purposes only. In addition, the various aspects described in the embodiments below may be used alone or in any combination and are not limited to the combinations described explicitly herein.

FIG. 1 illustrates exemplary components of a magnetic resonance imaging (MRI) system, in accordance with some embodiments. In the illustrative example of FIG. 1, MRI system 100 includes computing device 104, controller 106, pulse sequences repository 108, power management system 110, and magnetics components 120. It should be appreciated that system 100 is illustrative and that an MRI system may have one or more other components of any suitable type in addition to or instead of the components illustrated in FIG. 1. However, an MRI system will generally include these high-level components, though the implementation of these components for a particular MRI system may differ. It may be appreciated that the techniques described herein for isolated drive circuits may be used with any suitable type of MRI systems including high-field MRI systems, low-field MRI systems, and ultra-low field MRI systems. For example, the techniques described herein may be used with any of the MRI systems described herein and/or as described in U.S. Pat. No. 10,627,464 filed Jun. 30, 2017 and titled "Low-Field Magnetic Resonance Imaging Methods and Apparatus," which is incorporated by reference herein in its entirety.

As illustrated in FIG. 1, magnetics components 120 comprise $B_0$ magnets 122, shims 124, radio frequency (RF) transmit and receive coils 126, and gradient coils 128. $B_0$ magnets 122 may be used to generate the main magnetic field $B_0$. $B_0$ magnets 122 may be any suitable type or combination of magnetics components that can generate a desired main magnetic $B_0$ field. In some embodiments, $B_0$ magnets 122 may be a permanent magnet, an electromagnet, a superconducting magnet, or a hybrid magnet comprising one or more permanent magnets and one or more electromagnets and/or one or more superconducting magnets. In some embodiments, $B_0$ magnets 122 may be configured to generate a $B_0$ magnetic field having a field strength that is less than or equal to 0.2 T or within a range from 50 mT to 0.1 T. In some embodiments, shims 124 may include permanent magnet shims and/or shim coils.

For example, in some embodiments, $B_0$ magnets 122 may include a first and second $B_0$ magnet, each of the first and second $B_0$ magnets including permanent magnet blocks arranged in concentric rings about a common center. The first and second $B_0$ magnets may be arranged in a bi-planar configuration such that the imaging region is located between the first and second $B_0$ magnets. In some embodiments, the first and second $B_0$ magnets may each be coupled to and supported by a ferromagnetic yoke configured to capture and direct magnetic flux from the first and second $B_0$ magnets. Additional details of such embodiments are described in U.S. Pat. No. 10,545,207 titled "Low-Field magnetic Resonance Imaging Methods and Apparatus" filed on Apr. 18, 2018, which is incorporated by reference herein in its entirety.

Gradient coils 128 may be arranged to provide gradient fields and, for example, may be arranged to generate gradients in the $B_0$ field in three substantially orthogonal directions (X, Y, Z). Gradient coils 128 may be configured to encode emitted MR signals by systematically varying the $B_0$ field (the $B_0$ field generated by $B_0$ magnets 122 and/or shims 124) to encode the spatial location of received MR signals as a function of frequency or phase. For example, gradient coils 128 may be configured to vary frequency or phase as a linear function of spatial location along a particular direction, although more complex spatial encoding profiles may also be provided by using nonlinear gradient coils. In some embodiments, gradient coils 128 may be implemented using laminate panels (e.g., printed circuit boards). Examples of such gradient coils are described in U.S. Pat. No. 9,817,093 titled "Low Field Magnetic Resonance Imaging Methods and Apparatus" filed on Sep. 4, 2015, which is incorporated by reference herein in its entirety.

MRI is performed by exciting and detecting emitted MR signals using transmit and receive coils, respectively (often referred to as radio frequency (RF) coils). Transmit/receive coils may include separate coils for transmitting and receiving, multiple coils for transmitting and/or receiving, or the same coils for transmitting and receiving. Thus, a transmit/receive component may include one or more coils for transmitting, one or more coils for receiving and/or one or more coils for transmitting and receiving. Transmit/receive coils are also often referred to as Tx/Rx or Tx/Rx coils to generically refer to the various configurations for the transmit and receive magnetics component of an MRI system. These terms are used interchangeably herein. In FIG. 1, RF transmit and receive circuitry of transmit/receive electronics 114 comprises one or more transmit coils that may be used to generate RF pulses to induce an oscillating magnetic field $B_1$. The transmit coil(s) may be configured to generate any suitable types of RF pulses. The transmit and receive circuitry 114 may include additional electronic components of the transmit and receive chains, as described in U.S. Patent Application Publication No. 2019/0353723 titled "Radio-Frequency Coil Signal Chain for a Low-Field MRI System" and filed on May 21, 2019, which is hereby incorporated by reference in its entirety.

Power management system 110 includes electronics to provide operating power to one or more components of the low-field MRI system 100. For example, power management system 110 may include one or more power supplies, energy storage devices, gradient power components, transmit coil components, and/or any other suitable power electronics needed to provide suitable operating power to energize and operate components of MRI system 100. As illustrated in FIG. 1, power management system 110 includes power supply system 112, transmit/receive electronics 114, switching circuitry 116, and thermal management components 118 (e.g., cryogenic cooling equipment for superconducting magnets, water cooling equipment for electromagnets).

Power supply system 112 includes electronics to provide operating power to magnetic components 120 of the MRI system 100. The electronics of power supply system 112 may provide, for example, operating power to one or more gradient coils (e.g., gradient coils 128) to generate one or more gradient magnetic fields to provide spatial encoding of the MR signals. Additionally, the electronics of power supply system 112 may provide operating power (e.g., in the form of signals) to one or more RF coils (e.g., RF transmit and receive coils 126) to generate and/or receive one or more RF signals from the subject. For example, power supply system 112 may include a power supply configured to provide power from mains electricity to the MRI system and/or an energy storage device. The power supply may, in some embodiments, be an AC-to-DC power supply configured to convert AC power from mains electricity into DC power for use by the MRI system. The energy storage device may, in some embodiments, be any one of a battery, a capacitor, an ultracapacitor, a flywheel, or any other suitable energy storage apparatus that may bidirectionally receive (e.g., store) power from mains electricity and supply power to the MRI system. Additionally, power supply system 112 may include additional power electronics encompassing components including, but not limited to, power converters, switches, buses, drivers, and any other suitable electronics for supplying the MRI system with power.

Transmit/receive electronics 114 may include one or more RF receive (Rx) pre-amplifiers that amplify MR signals detected by one or more RF receive coils (e.g., coils 126), one or more RF transmit (Tx) power components configured to provide power to one or more RF transmit coils (e.g., coils 126), one or more gradient power components configured to provide power to one or more gradient coils (e.g., gradient coils 128), and one or more shim power components configured to provide power to one or more shims (e.g., shim coils).

Switching circuitry 116 may be configured to control the RF transmit and/or receive coils 126. In some embodiments, switching circuitry 116 may be configured to select whether RF transmit coils or RF receive coils are being operated. For example, switching circuitry 116 may be configured to impedance match and/or tune the RF transmit coils and/or RF receive coils to a resonant frequency band, as described further herein. Alternatively or additionally, switching circuitry 116 may be configured to couple and decouple RF transmit coils and/or RF receive coils to transmit/receive electronics 114, as described further herein.

As illustrated in FIG. 1, MRI system 100 includes controller 106 (also referred to as a console) having control electronics to send instructions to and receive information from power management system 110. Controller 106 may be configured to implement one or more pulse sequences, which are used to determine the instructions sent to power management system 110 to operate the magnetic components 120 in a desired sequence (e.g., parameters for operating the RF transmit and receive coils 126, parameters for operating gradient coils 128, etc.). As illustrated in FIG. 1, controller 106 also interacts with computing device 104 programmed to process received MR data. For example, computing device 104 may process received MR data to generate one or more MR images using any suitable image reconstruction process(es). Controller 106 may provide information about one or more pulse sequences to computing device 104 for the processing of data by the computing device. For example, controller 106 may provide information about one or more pulse sequences to computing device 104 and the computing device may perform an image reconstruction process based, at least in part, on the provided information.

In some embodiments, controller 106 may be configured to control RF switches using drive circuits described herein in accordance with selected pulse sequences. For example, controller 106 may be configured to impedance match, tune and/or detune the RF transmit and receive coils 126 to transmit and/or receive signals in accordance with a pulse sequence and to receive signals from the imaging region. Alternatively or additionally, controller 106 may be configured to couple and/or decouple RF transmit and receive coils 126 to and from transmit/receive electronics 114 in accordance with a pulse sequence and to receive signals from the imaging region. It should be appreciated that MRI system 100 may include a separate controller to operate the RF switches that may be communicatively coupled to controller 106 as embodiments are not so limited in this respect.

Computing device 104 may be any electronic device configured to process acquired MR data and generate one or more images of a subject being imaged. In some embodiments, computing device 104 may be located in a same room as the MRI system 100 and/or coupled to the MRI system 100. In some embodiments, computing device 104 may be a fixed electronic device such as a desktop computer, a server, a rack-mounted computer, or any other suitable fixed electronic device that may be configured to process MR data and generate one or more images of the subject being imaged. Alternatively, computing device 104 may be a portable device such as a smart phone, a personal digital assistant, a laptop computer, a tablet computer, or any other portable device that may be configured to process MR data and generate one or images of the subject being imaged. In some embodiments, computing device 104 may include multiple computing devices of any suitable type, as embodiments of the technology described herein are not limited in this respect.

Figure 2:
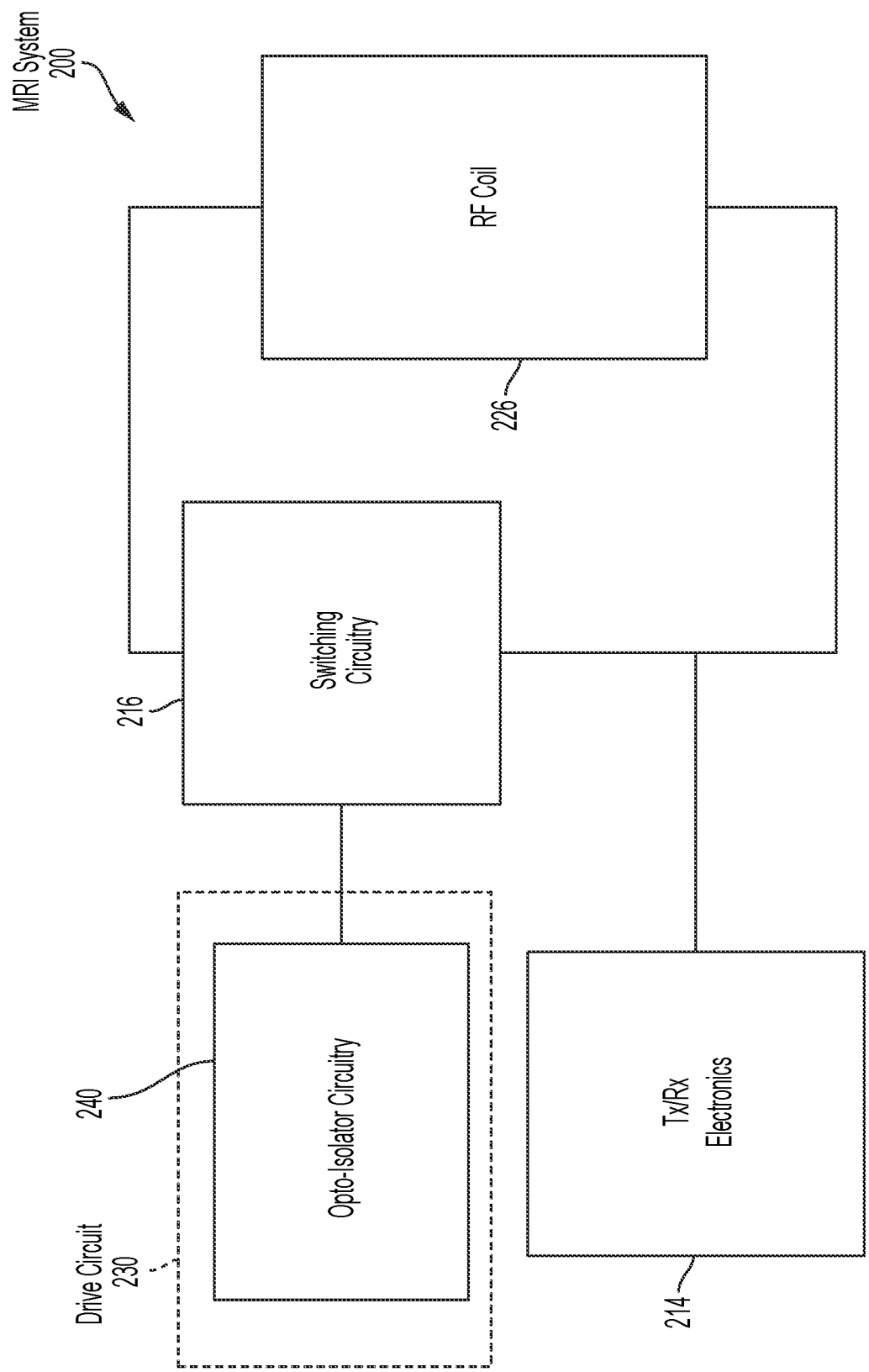
FIG. 2 is a drawing of a portion of an illustrative MRI system 200 including a radio frequency (RF) coil 226, switching circuitry 216 coupled to the RF coil 226, and a drive circuit 230 that includes opto-isolator circuitry 240 configured to control the switching circuitry 216, in accordance with some embodiments of the technology described herein.

FIG. 2 is a drawing of a portion of an illustrative MRI system 200 including RF coil 226, switching circuitry 216 coupled to RF coil 226, and a drive circuit 230 configured to control switching circuitry 216, in accordance with some embodiments of the technology described herein. As shown in FIG. 2, MRI system 200 includes an RF coil 226, which may be configured in the manner described here for RF coil(s) 126 including in connection with FIG. 1. For example, RF coil 226 may be an RF transmit coil, an RF receive coil, or an RF transmit and receive coil. In FIG. 2, MRI system 200 also includes transmit/receive electronics 214, which may be configured in the manner described herein for transmit/receive electronics 114 including in connection with FIG. 1. As shown in FIG. 2, switching circuitry 216 is coupled to RF coil 226 and may be configured in the manner described herein for switching circuitry 116 including in connection with FIG. 1. For example, switching circuitry 216 may be configured to control (e.g., tune and/or detune) RF coil 226. In FIG. 2, drive circuit 230 is coupled to switching circuitry 216 and includes opto-isolator circuitry 240. In some embodiments, drive circuit 230 may be configured to control switching circuitry 216. For example, opto-isolator circuitry 240 may be configured to control one or more RF switches of switching circuitry 216 between conductive and nonconductive states, as described further herein.

In some embodiments, drive circuit 230 and switching circuitry 216 may be positioned on one or more printed circuit boards (PCBs). In some embodiments, components of drive circuit 230 and/or switching circuitry 216 may be mounted on PCB(s), such as through hole and/or surface mounted. For example, some or all components may be coupled via conductive traces on one or more layers of the PCB(s). In some embodiments, components of opto-isolator circuitry 240 of drive circuit 230 may be positioned on a single PCB with a common isolation barrier formed in the PCB (e.g., one or more holes cut through the PCB). For example, components of opto-isolator circuitry 240 may have their individual isolation barriers aligned with the common isolation barrier as portions of the common isolation barrier. In some embodiments, switching circuitry 216 may be positioned on a different PCB or PCB(s) from drive circuit 230.

In some embodiments, transmit/receive electronics 214 may be configured to provide RF signals to and/or receive RF signals from RF coil 226. In some embodiments, transmit/receive electronics 214 may include one or more transmit amplifiers (e.g., power amplifiers). For example, in response to a pulse sequence implemented by controller 106, transmit/receive electronics 214 may be configured to provide an RF signal to RF coil 226 for transmitting to the imaging region. Alternatively or additionally, in some embodiments, transmit/receive electronics may include one or more receive amplifiers (e.g., low noise amplifiers). For example, transmit/receive electronics 214 may be configured to obtain an RF signal from RF coil 226 received from the imaging region.

In some embodiments, switching circuitry 216 may include one or more RF switches configured to control RF coil 226. For example, the RF switch(es) may be configured to tune and/or detune RF coil 226. Alternatively or additionally, the RF switch(es) may be configured to couple and/or decouple RF coil 226 to and/or from transmit/receive electronics 214. In some embodiments, the RF switch(es) may include one or more PIN diodes and/or one or more FETs, such as GaN FETs. In some embodiments, switching circuitry 216 may be coupled in series with RF coil 226.

In some embodiments, drive circuit 230 may be configured to control switching circuitry 216. For example, drive circuit 230 may be configured to apply a DC bias to switching circuitry 216 to cause one or more RF switches of switching circuitry 216 to enter a conductive state and/or a nonconductive state. As shown in FIG. 2, drive circuit 230 includes opto-isolator circuitry 240. For example, opto-isolator circuitry 240 may be configured to generate and provide the DC bias to switching circuitry 216 while galvanically isolating switching circuitry 216 from a switch controller (e.g., controller 106) using an isolation barrier. In some embodiments, opto-isolator circuitry 240 may include an isolated power supply and an isolated driver, as described further herein. Alternatively or additionally, in some embodiments, opto-isolator circuitry 240 may include feedback circuitry configured to provide feedback across the isolation barrier. By including opto-isolator circuitry 240, the switch controller may be galvanically isolated from switching circuitry 216 without including any ferromagnetic materials as required for transformer-based isolators. It should be appreciated that trace amounts of ferromagnetic materials may be included in some embodiments, such as in packaging of opto-isolator circuitry 240, but not in the circuit components of opto-isolator circuitry 240.

It should be appreciated that, in some embodiments, the isolation barrier may be configured to galvanically isolate one or more controllers of MRI system 200 from switching circuitry 216, RF coil 226, transmit/receive electronics 214, and/or any other component of MRI system 200 from which isolation is desired.

FIGS. 3A to 3E illustrate various exemplary configurations of an MRI system including an RF coil, switching circuitry coupled to the RF coil, and one or more drive circuits configured to control the switching circuitry, in accordance with some embodiments of the technology described herein.

Figure 3A:
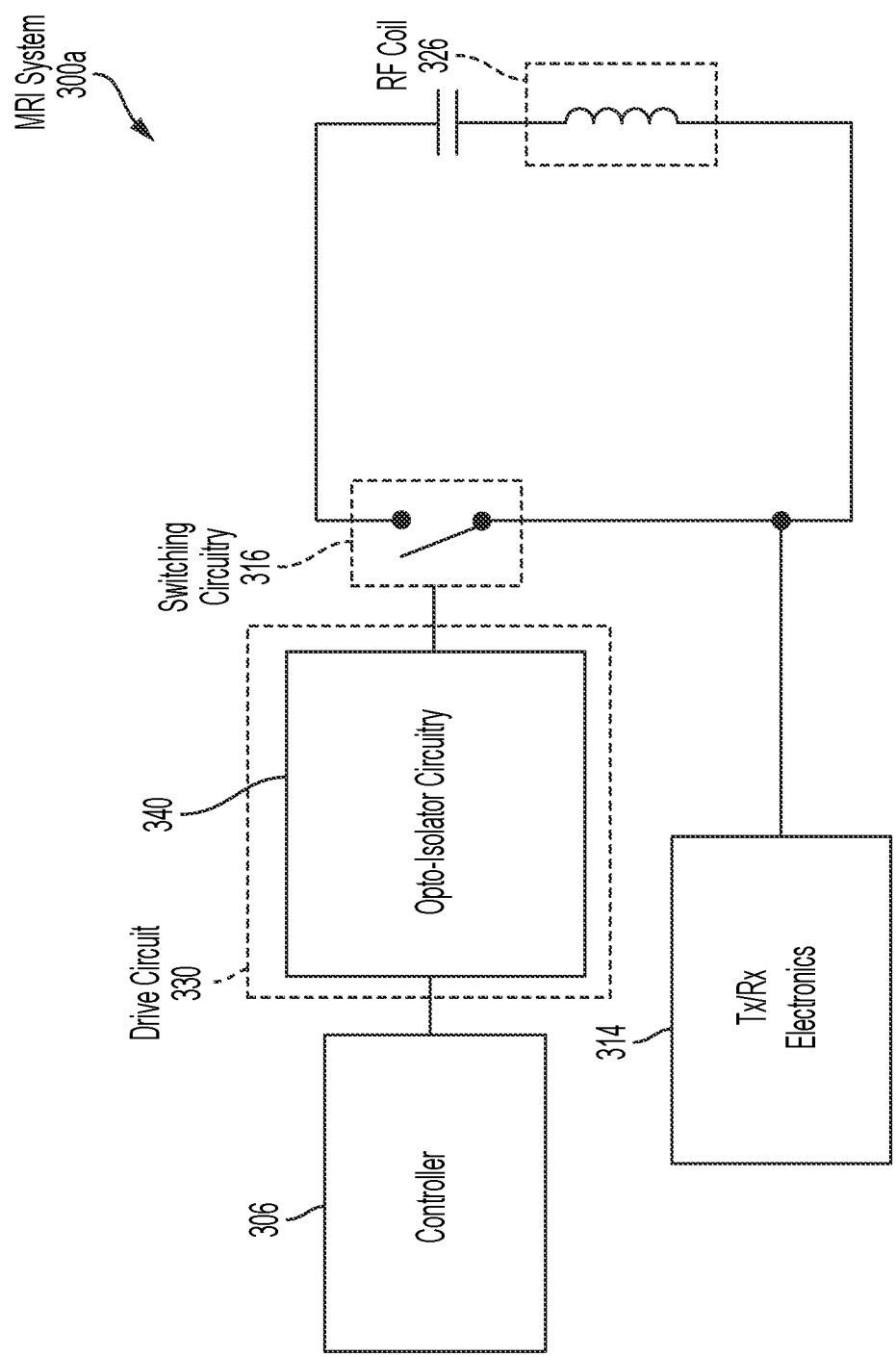
FIG. 3A is a drawing of a portion of an illustrative MRI system 300a including switching circuitry 316 configured to detune an RF coil 326 by spoiling the RF coil 326, in accordance with some embodiments of the technology described herein.

FIG. 3A is a drawing of a portion of an illustrative MRI system 300a including switching circuitry 316 configured to detune an RF coil 326 by spoiling the RF coil 226, in accordance with some embodiments of the technology described herein. In FIG. 3A, MRI system 300a includes transmit/receive electronics 316, which may be configured to provide an RF signal to RF coil 326 to be transmitted to the imaging region and/or obtain an RF signal from RF coil 326 received from the imaging region. For example, RF coil 326 may include an RF transmit coil and/or an RF receive coil. In FIG. 3A, MRI system 300a also includes drive circuit 330 and switching circuitry 316, which may be configured in the manner described herein for drive circuit 230 and switching circuitry 216 including in connection with FIG. 2. For instance, in FIG. 3A, switching circuitry 316 is shown coupled in series with RF coil 326. As shown in FIG. 3A, RF circuitry 300a also includes controller 306, which may be configured in the manner described herein for controller 106 including in connection with FIG. 1 and/or may be separate from and communicatively coupled to at least a portion of controller 106. In some embodiments, opto-isolator circuitry 340 of drive circuit 330 may be configured to galvanically isolate switching circuitry 316 from controller 306.

In some embodiments, switching circuitry 316 may be configured to detune RF coil 326 by spoiling RF coil 326. For example, when switching circuitry 316 is in a conductive state, RF coil 326 may be coupled to transmit/receive electronics 314 at both ends, and RF signals may flow to and/or from transmit/receive electronics 314 through RF coil 326. On the other hand, when switching circuitry 316 is in a nonconductive state, one end of RF coil 326 may be decoupled from transmit/receive electronics 314, and an impedance of switching circuitry 316 when in the nonconductive state may be large enough to prevent substantially any RF signals from flowing to and/or from transmit/receive electronics 314 through RF coil 326 and vice versa. Thus, when switching circuitry 316 is in a nonconductive state, RF coil 326 may be spoiled, thereby preventing RF coil 326 from coupling to other coils and interfering with transmitted or received signals.

In some embodiments, controller 306 may be configured to control whether switching circuitry 316 is in a conductive or nonconductive state via drive circuit 330. For example, controller 306 may be configured to send bias and/or control signals to drive circuit 330 that cause opto-isolator circuitry 340 to apply a DC bias to switching circuitry 316, thereby placing switching circuitry 316 in a conductive or nonconductive state.

Figure 3B:
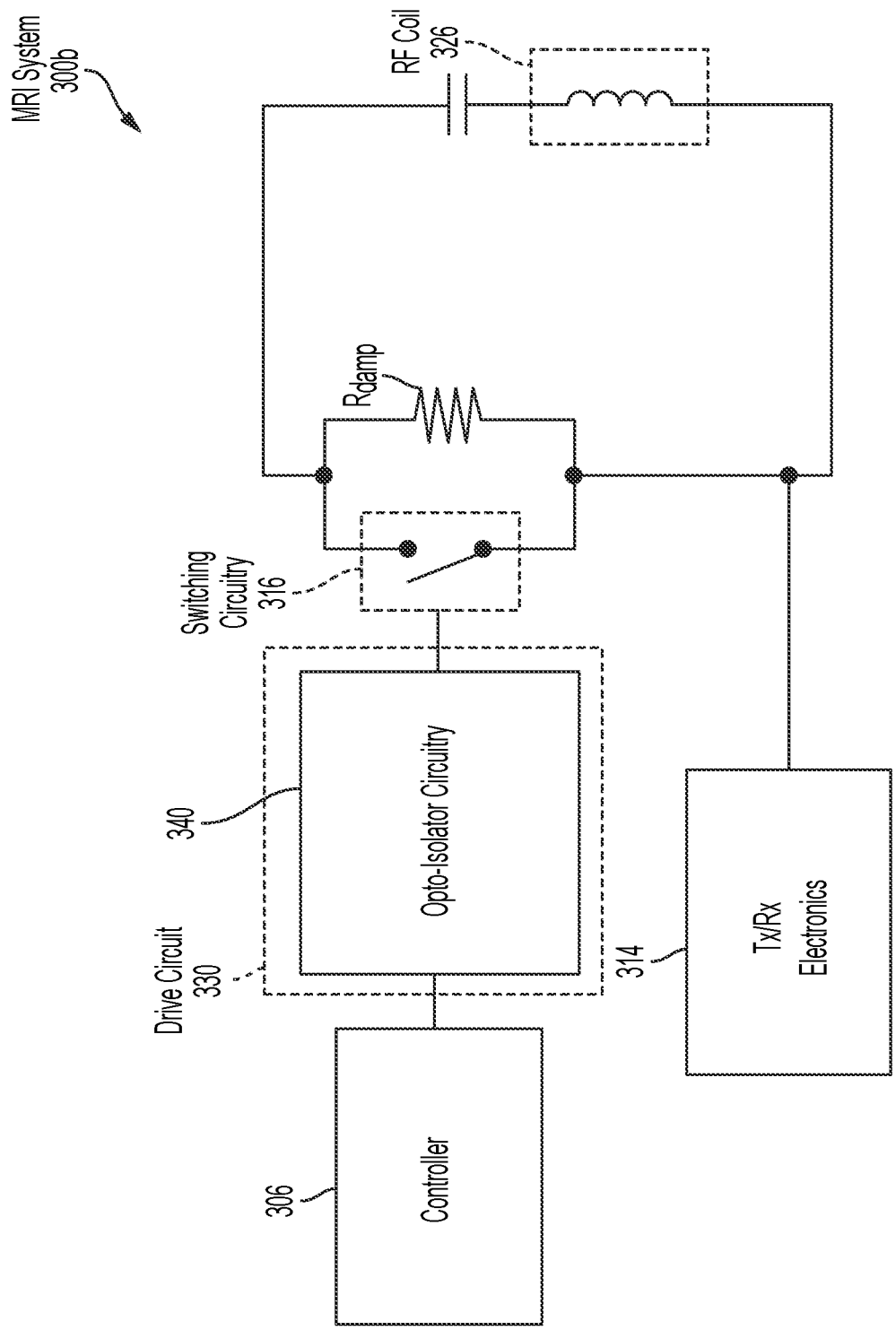
FIG. 3B is a drawing of a portion of an illustrative MRI system 300b including switching circuitry 316 configured to detune an RF coil 326 by damping the RF coil 326, in accordance with some embodiments of the technology described herein.

FIG. 3B is a drawing of a portion of an illustrative MRI system 300b including switching circuitry 316 configured to detune an RF coil 326 by damping the RF coil 326, in accordance with some embodiments of the technology described herein. As shown in FIG. 3B, MRI system 300b may be configured in the manner described herein for MRI system 300a. Additionally, in FIG. 3B, a damping resistor $R_{damp}$ is coupled in parallel with switching circuitry 316.

In some embodiments, MRI system 300b may be configured to detune RF coil 326 by damping RF coil 326. For example, when switching circuitry 316 is in a conductive state, MRI system 300b may be configured to operate in the manner described herein for MRI system 300a including in connection with FIG. 3A. When switching circuitry 316 is in a nonconductive state, damping resistor $R_{damp}$ may be configured to dampen RF signals flowing in RF coil 326, thereby reducing coupling between RF coil 326 and other coils and reducing any interference that would otherwise result from the coupling.

Figure 3C:
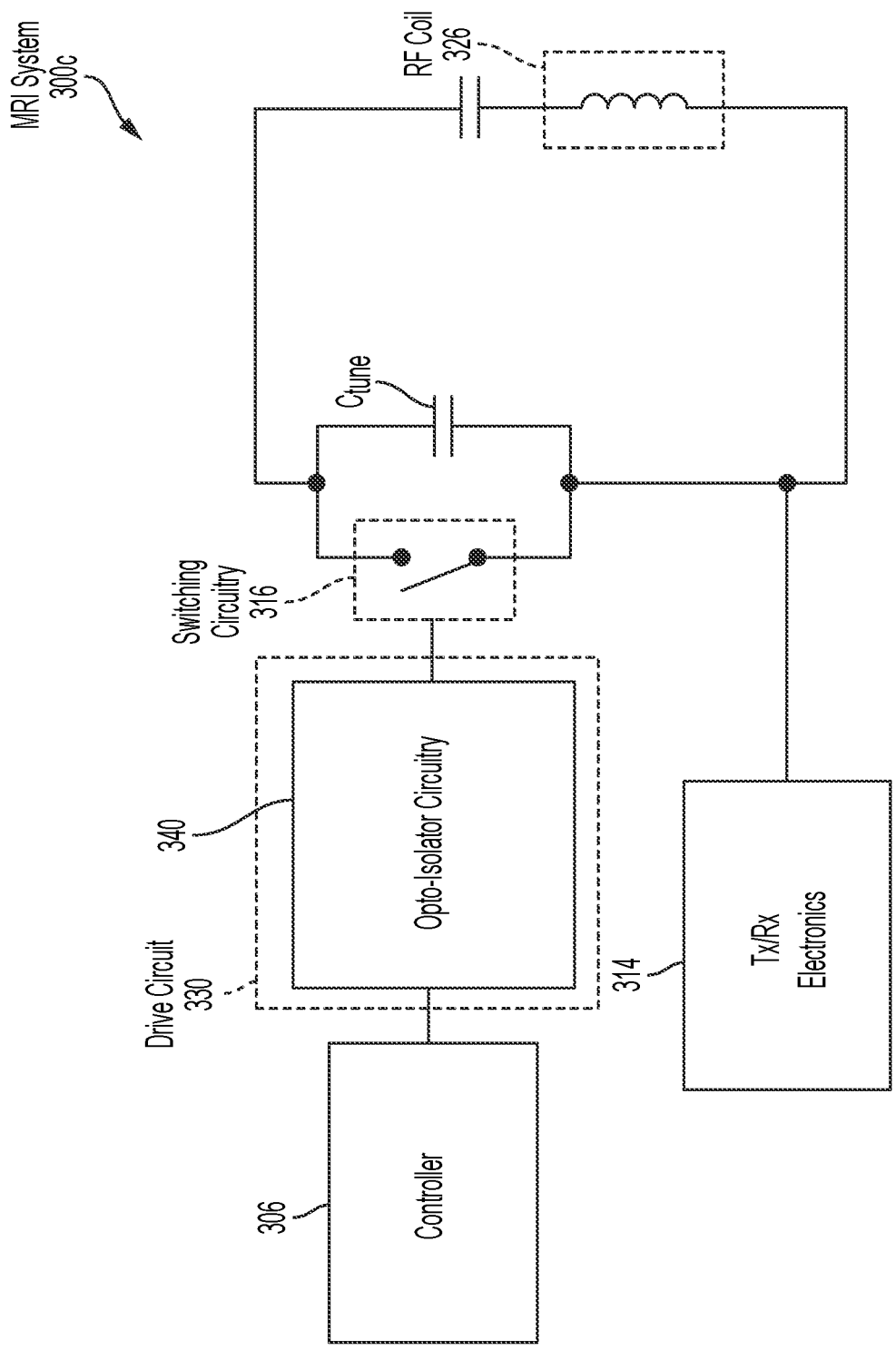
FIG. 3C is a drawing of a portion of an illustrative MRI system 300c including switching circuitry 316 configured to impedance match and/or tune an RF coil 326 to a resonant frequency band, in accordance with some embodiments of the technology described herein.

FIG. 3C is a drawing of a portion of an illustrative MRI system 300c configured to impedance match and/or tune an RF coil 326 to a resonant frequency band, in accordance with some embodiments of the technology described herein. As shown in FIG. 300c, MRI system 300c may be configured in the manner described herein for MRI system 300b. In FIG. 3C, a tuning capacitor $C_{tune}$ is coupled in parallel with switching circuitry 316.

In some embodiments, switching circuitry 316 may be configured to tune RF coil 326 to a resonant frequency band. For example, when switching circuitry 316 is in a conductive state, current flowing through RF coil 326 may bypass tuning capacitor $C_{tune}$ by flowing through switching circuitry 316. In this example, RF coil 326 may be tuned to a first resonant frequency band when current flowing through RF coil 326 bypasses tuning capacitor $C_{tune}$. Alternatively, when switching circuitry 316 is in a nonconductive state, current flowing through RF coil 326 may flow through tuning capacitor $C_{tune}$, thereby tuning RF coil 326 to a second resonant frequency band.

In some embodiments, when RF coil 326 is tuned to the first resonant frequency band, RF coil may be configured to transmit and/or receive RF signals to and/or from the imaging region. In some embodiments, when RF coil 326 is tuned to the second resonant frequency band, RF coil 326 may be configured to transmit and/or receive RF signals to and/or from the imaging region. In some embodiments, when RF coil 326 is tuned to the first resonant frequency band, RF coil 326 may be configured not to couple to other RF coils tuned to the second resonant frequency band, and/or vice versa. It should be appreciated that, in some embodiments, RF coil 326 may have a high quality factor, such that the resonant frequency bands to which RF coil 326 may be tuned can be as narrow as only a few hertz (Hz).

Alternatively or additionally, in some embodiments, switching circuitry 316 may be configured to impedance match RF coil 326 to transmit/receive electronics 314 and/or vice versa. For example, when RF coil 326 is impedance matched to transmit/receive electronics 314, substantially all signals transmitted from transmit/receive electronics 314 to RF coil 326 may reach RF coil 326 rather than reflecting back to transmit/receive electronics 314. In this example, when transmit/receive electronics 314 are impedance matched to RF coil 326, substantially all signals received by RF coil 326 and provided to transmit/receive electronics 314 may reach transmit/receive electronics 314 rather than reflecting back to RF coil 326. In some embodiments, substantially all signals may be transmitted rather than reflected when a voltage standing wave ratio (VSWR) of 3 or lower is achieved via impedance match. In some embodiments, substantially all signals may be transmitted rather than reflected when a VSWR of 2 or lower is achieved via impedance match.

In some embodiments, when switching circuitry 316 is in a conductive state and current flowing through RF coil 326 bypasses tuning capacitor $C_{tune}$ by flowing through switching circuitry 316, a first impedance that does not include tuning capacitor $C_{tune}$ may be coupled between transmit/receive electronics 314 and RF coil 326. Alternatively, when switching circuitry 316 is in a nonconductive state and current flowing through RF coil 316 may flow through tuning capacitor $C_{tune}$, a second impedance that does include tuning capacitor $C_{tune}$ may be coupled between transmit/receive electronics 314 and RF coil 326. In some embodiments, RF coil 326 may be impedance matched to transmit/receive electronics 314 when the first impedance is coupled between transmit/receive electronics 314 and RF coil 326. In some embodiments, RF coil 326 may be impedance matched to transmit/electronics 314 when the second impedance is coupled between transmit/receive electronics 314 and RF coil 326.

Figure 3D:
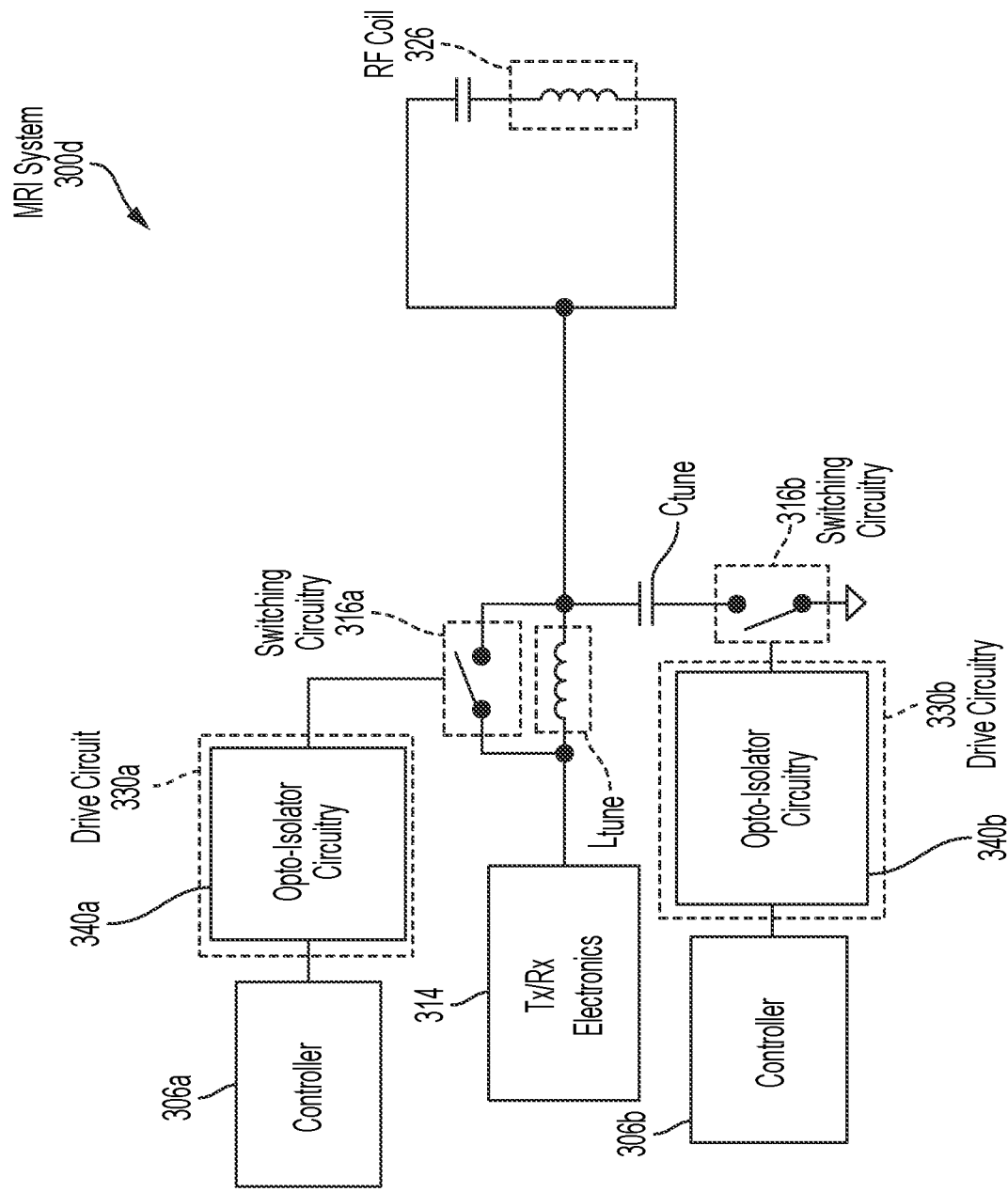
FIG. 3D is a drawing of a portion of an alternative illustrative MRI system 300d including switching circuitry 316a and 316b configured to impedance match and/or tune an RF coil 326 to a resonant frequency band, in accordance with some embodiments of the technology described herein.

FIG. 3D is a drawing of a portion of an alternative illustrative MRI system 300d configured to impedance match and/or tune an RF coil 326 to a resonant frequency band, in accordance with some embodiments of the technology described herein. In some embodiments, MRI system 300d may be configured in the manner described herein for MRI system 300c. As shown in FIG. 3D, MRI system 300d includes multiple controllers 306a and 306b, drive circuits 330a and 330b, and switching circuitry 316a and 316b, which may be configured in the manner described herein for controller 306, drive circuit 330, and switching circuitry 316 including in connection with FIGS. 3A to 3C. MRI system 300d also includes a tuning inductor $L_{tune}$ coupled in parallel with switching circuitry 316a and a tuning capacitor $C_{tune}$ coupled in series with switching circuitry 316b.

In some embodiments, switching circuitry 316a and 316b may be configured to tune RF coil 326 to a resonant frequency band. For example, when switching circuitry 316a is in a conductive state and switching circuitry 316b is in a nonconductive state, current flowing through RF coil 326 may bypass tuning inductor $L_{tune}$ by flowing through switching circuitry 316a and bypass tuning capacitor $C_{tune}$ due to the high impedance of switching circuitry 316b when nonconductive. In this example, RF coil 326 may be tuned to a first resonant frequency band when current flowing through RF coil 326 bypasses tuning inductor $L_{tune}$ and tuning capacitor $C_{tune}$. Alternatively, when switching circuitry 316a is in a nonconductive state and switching circuitry 316b is in a conductive state, tuning inductor $L_{tune}$ and tuning capacitor $L_{tune}$ may form a resonant inductor-capacitor (LC) circuit, thereby tuning RF coil 326 to a second resonant frequency band. It should be appreciated that, in some embodiments, switching circuitry 316a and 316b may be configured to tune RF coil 326 among more than two frequency bands, such as to a third frequency band when switching circuitry 316a and 316b are each in a conductive state and/or a fourth frequency band when switching circuitry 316a and 316b are each in a nonconductive state.

Alternatively or additionally, in some embodiments, switching circuitry 316 and 316b may be configured to impedance match RF coil 326 to transmit/receive electronics 314, and/or vice versa, as described herein for switching circuitry 316 including in connection with FIG. 3C. In some embodiments, when switching circuitry 316a is in a conductive state and switching circuitry 316b is in a nonconductive state, and current flowing through RF coil 326 bypasses tuning inductor $L_{tune}$ and tuning capacitor $C_{tune}$ by flowing through switching circuitry 316a and not flowing through switching circuitry 316b, a first impedance that does not include tuning inductor $L_{tune}$ or tuning capacitor $C_{tune}$ may be coupled between transmit/receive electronics 314 and RF coil 326. Alternatively, when switching circuitry 316a is in a nonconductive state and switching circuitry 316b is in a conductive state and current flowing through RF coil 316 may flow through tuning inductor $L_{tune}$ and tuning capacitor $C_{tune}$, a second impedance that does include tuning inductor $L_{tune}$ and tuning capacitor $C_{tune}$ may be coupled between transmit/receive electronics 314 and RF coil 326. In some embodiments, RF coil 326 may be impedance matched to transmit/receive electronics 314 when the first impedance is coupled between transmit/receive electronics 314 and RF coil 326. In some embodiments, RF coil 326 may be impedance matched to transmit/electronics 314 when the second impedance is coupled between transmit/receive electronics 314 and RF coil 326. It should be appreciated that, in some embodiments, switching circuitry 316a and 316b may be configured to couple other impedances between RF coil 326 and transmit/receive electronics 314, such as a third impedance when switching circuitry 316a and 316b are each in a conductive state and/or a fourth impedance when switching circuitry 316a and 316b are each in a nonconductive state.

In some embodiments, controllers 306a and 306b may be configured to control whether switching circuitry 316a and 316b are in conductive or nonconductive states via drive circuits 330a and 330b in the manner described herein for controller 306 including in connection with FIG. 3A. In some embodiments, controllers 306a and 306b may be configured to control switching circuitry 316a to be in a conductive state when switching circuitry 316b is in a nonconductive state, and/or vice versa. For example, controllers 306a and 306b may be configured to provide opposite signals to drive circuits 330a and 330b.

Figure 3E:
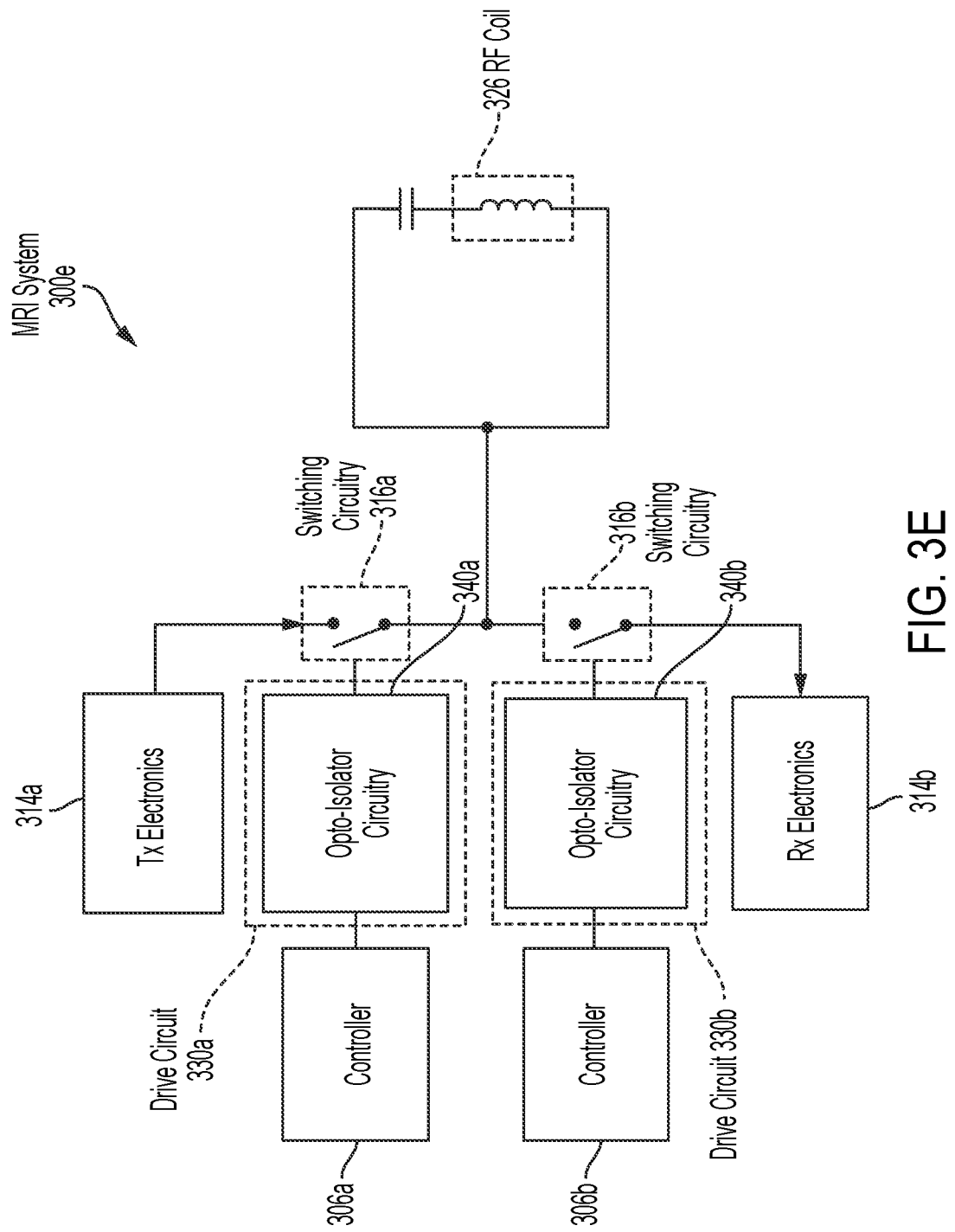
FIG. 3E is a drawing of a portion of an illustrative MRI system 300e including switching circuitry 316a and 316b configured to couple and decouple transmit electronics 314a and receive electronics 314b to and from an RF coil 326, in accordance with some embodiments of the technology described herein.

FIG. 3E is a drawing of a portion of an illustrative MRI system 300e including switching circuitry 316a and 316b configured to couple and decouple transmit electronics 314a and receive electronics 314b to and from an RF coil 326, in accordance with some embodiments of the technology described herein. In some embodiments, MRI system 300e may be configured in the manner described herein for MRI system 300d. As shown in FIG. 3E, MRI system 300e includes switching circuitry 316a coupled in series between transmit electronics 314a and RF coil 326 and switching circuitry 316b coupled in series between receive electronics 314b and RF coil 326.

In some embodiments, switching circuitry 316a may be configured to couple transmit electronics 314a to RF coil 326. For example, when controller 306a sends a control signal and/or bias signal to drive circuit 330a, opto-isolator circuitry 340a may be configured to apply a DC bias to switching circuitry 316a that causes switching circuitry 316a to enter a conductive state, thereby coupling transmit electronics 314a and RF coil 326. In some embodiments, controller 306b, drive circuit 330b, opto-isolator circuitry 340b, and switching circuitry 316b may be configured in the same manner to couple receive electronics 314b to RF coil 326.

In some embodiments, switching circuitry 316a may be configured to decouple transmit electronics 314a from RF coil 326 when receive electronics 314b is coupled to RF coil 326 and/or vice versa. For example, controllers 306a and 306b may be configured to send opposite signals to drive circuits 330a and 330b such that switching circuitry 316a is in a conductive state when switching circuitry 316b is in a nonconductive state, and/or vice versa.

Although switching circuitry 316 is illustrated in FIGS. 3A-3E including a single switch, it should be appreciated that switching circuitry 316 may include any number of switches configured in series, anti-series, and/or parallel with one another. For example, controller 306 and/or drive circuit 330 may be configured to provide a same DC bias to some switches and/or different DC biases to different ones of the switches, according to various embodiments.

Figure 4:
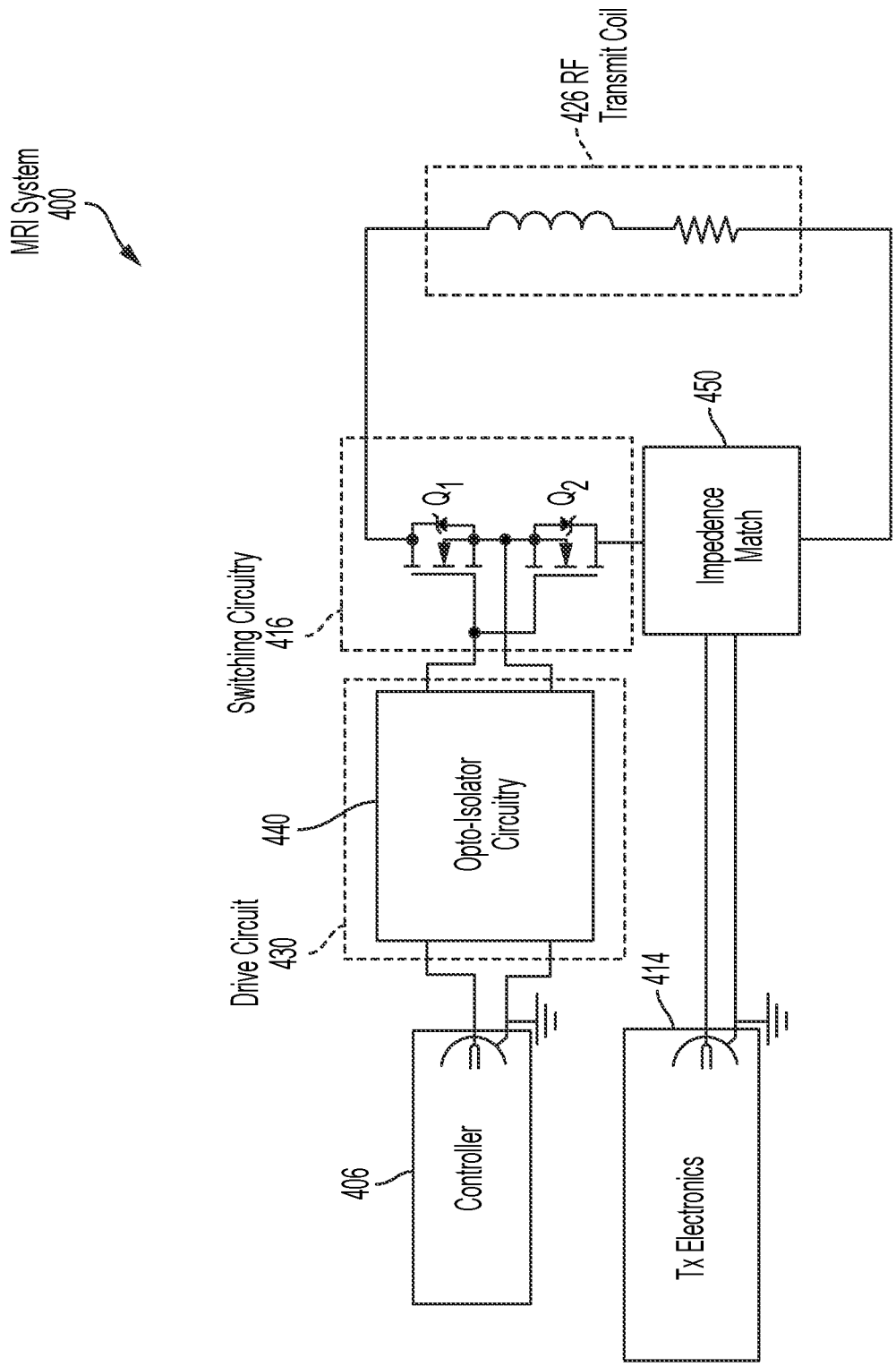
FIG. 4 is a drawing of a portion of an illustrative MRI system 400 including an RF transmit coil 426, switching circuitry 416 coupled to the RF coil 426, and a drive circuit 430 that includes opto-isolator circuitry 440 configured to control the switching circuitry 416, in accordance with some embodiments of the technology described herein.

FIG. 4 is a drawing of a portion of an illustrative MRI system 400 including an RF transmit coil 326, switching circuitry 416 coupled to the RF transmit coil 326, and a drive circuit 430 including opto-isolator circuitry 440 configured to control the switching circuitry 416, in accordance with some embodiments of the technology described herein. As shown in FIG. 4, MRI system 400 includes controller 406, drive circuit 430, and switching circuitry 416, which may be configured in the manner described herein for controller 306, drive circuit 330, and switching circuitry 316 including in connection with FIG. 3A. In FIG. 4, MRI system 400 further includes transmit electronics 414, which may be configured to provide RF signals to RF transmit coil 326 for transmitting to the imaging region, and impedance match circuit 450, which may be configured to match an impedances of RF transmit coil 326 to transmit electronics 414 to prevent reflection of signals from transmit electronics 414 back to transmit electronics 414. It should be appreciated that, in some embodiments, RF transmit coil 326 may also be configured to receive RF signals from the imaging region.

As shown in FIG. 4, switching circuitry 416 includes first and second switches $Q_1$ and $Q_2$ coupled in series with RF transmit coil 326. In the illustrated example of FIG. 4, first and second switches $Q_1$ and $Q_2$ include GaN FETs coupled in an anti-series configuration.

For instance, as shown in FIG. 4, when first switch $Q_1$ is in a non-conductive state, first switch $Q_1$ may be configured to block current from flowing through first switch $Q_1$ in a first direction from RF transmit coil 326 toward impedance match 450, and when second switch $Q_2$ is in a non-conductive state, second switch $Q_2$ may be configured to block current from flowing through second switch $Q_2$ in a second direction opposite the first direction from impedance match 450 toward RF transmit coil 326. In FIG. 4, first and second switches $Q_1$ and $Q_2$ include diodes configured with opposite facing polarities and each configured to block current from flowing in a respective one of the first and second directions, thus combining to block current from flowing in either of the first and second directions when the first and second switches $Q_1$ and $Q_2$ are in a non-conductive state. For example, the diode of first switch $Q_1$ may be configured to block portions of an RF signal from transmit electronics 414 having positive polarity (e.g., a positive half cycle of a periodic RF signal) from flowing through RF transmit coil 326, and the diode of second switch $Q_2$ may be configured to block portions of the RF signal that have negative polarity (e.g., a negative half cycle of a periodic RF signal) from flowing through RF transmit coil 326.

In some embodiments, opto-isolator circuitry 440 of drive circuit 430 may be configured to apply a DC bias to switching circuitry 416 to control switching circuitry 416. For example, opto-isolator circuitry 440 may be coupled to one or more control terminals of switching circuitry 416. As shown in FIG. 4, a first output of opto-isolator circuitry 440 is coupled to control terminals of the GaN FETs of first switch $Q_1$ and second switch $Q_2$, and a second output of opto-isolator circuitry 440 is coupled to the source terminals of first and second switches $Q_1$ and $Q_2$. For example, opto-isolator circuitry 440 may be configured to apply a DC bias voltage between the control terminals and the source terminals of the FETs of first switch $Q_1$ and second switch $Q_2$ to cause the FETs to become conductive or nonconductive. It should be appreciated that switching circuitry described herein may include any number and any kind of RF switches. For example, switching circuitry described herein may include one or more FETs, bipolar junction transistors (BJTs), diodes, high electron mobility transistors (HEMTs) and/or heterojunction bipolar transistors (HBTs), as embodiments described herein are not so limited. Additionally, switching circuitry described herein may have any conductivity type including n-type channels and/or p-type channels. For example, drive circuits described herein may be configured to control p-channel switches at least in part by reversing the polarity of bias voltages applied to the switching circuitry, such that the voltage of the source terminal(s) is higher than the voltage at the gate terminal(s) for the switching circuitry to be in a conductive state.

Figure 5:
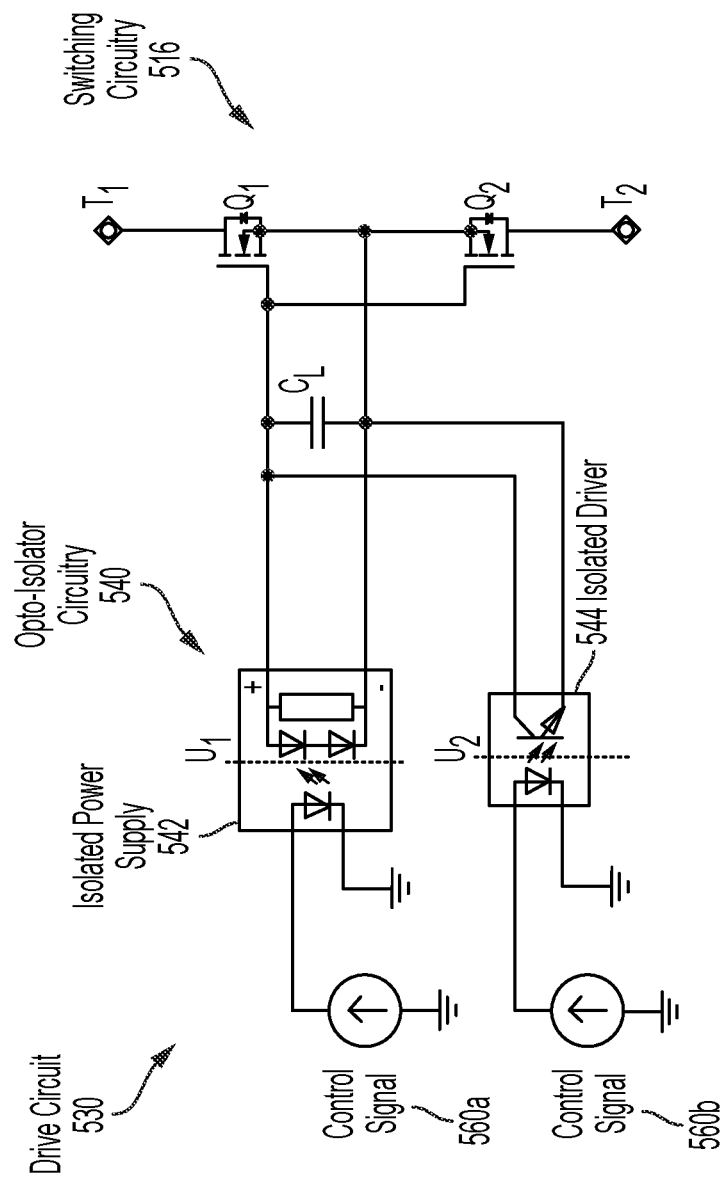
FIG. 5 is a drawing of an illustrative drive circuit 530 and switching circuitry 516, the drive circuit 530 including opto-isolator circuitry 540 configured to control the switching circuitry 516, in accordance with some embodiments of the technology described herein.

FIG. 5 is a drawing of an illustrative drive circuit 530 and switching circuitry 516, the drive circuit 530 including opto-isolator circuitry 540 configured to control the switching circuitry 516, in accordance with some embodiments of the technology described herein. In some embodiments, opto-isolator circuitry 540 of drive circuit 530 may be configured to control switching circuitry 516 based on control signals 560a and 560b. For example, control signals 560a and 560b may be received from a controller (e.g., controller 306) and/or generated based on signals received from the controller, such as using one or more current sources controlled by the controller. As shown in FIG. 5, switching circuitry 516 includes first and second switches $Q_1$ and $Q_2$, which may be configured in the manner described herein for switching circuitry 416 including in connection with FIG. 4. Additionally, in FIG. 5, an illustrative capacitance $C_L$ representative of the gate capacitance of first and second switches $Q_1$ and $Q_2$ is shown coupled between the control terminals and source terminals of first and second switches $Q_1$ and $Q_2$.

In some embodiments, switching circuitry 516 may be configured for coupling to one or more components of an MRI system. For example, ports $T_1$ and $T_2$ shown in FIG. 5 may be configured for conductively coupling to an RF coil, RF transmit electronics, and/or RF receive electronics, such as described herein including with reference to FIGS. 3A to 3E.

In FIG. 5, opto-isolator circuitry 540 includes isolated power supply 542 and isolated driver 544, which may be configured to control switching circuitry 516. In some embodiments, isolated power supply 542 may be configured to apply a bias voltage to switching circuitry 516 based on control signal 560a. For example, in FIG. 5, a first output of isolated power supply 542 is coupled to control terminals of first and second switches $Q_1$ and $Q_2$ and a second output of isolated power supply 542 is coupled to source terminals of first and second switches $Q_1$ and $Q_2$. Also shown in FIG. 5, isolated power supply 542 includes a PVI with an isolation barrier, a light emitting diode (LED) on a first side of the isolation barrier, and two photodiodes on the second side of the isolation barrier. In FIG. 5, the LED of the PVI is shown configured to receive control signal 560a. For example, the LED may be configured to transmit a light signal across the isolation barrier to the photodiodes based on control signal 560a, and the photodiodes may be configured to generate a bias voltage to apply to switching circuitry 516 based on the received light signal.

In some embodiments, isolated driver 544 may be configured to discharge the bias voltage from switching circuitry 516 in response to control signal 560b. As shown in FIG. 5, isolated driver 544 is coupled between the control terminals and the source terminals of first and second switches $Q_1$ and $Q_2$. For example, in FIG. 5, the phototransistor includes an isolation barrier, an LED on a first side of the isolation barrier, and a phototransistor on a second side of the isolation barrier. Also shown in FIG. 5, the LED is configured to receive control signal 560b. For example, the LED may be configured to transmit a light signal across the isolation barrier to the phototransistor based on control signal 560b, and the phototransistor may be configured to become conductive or nonconductive based on the received light signal. In some embodiments, when the phototransistor becomes conductive, the phototransistor may be configured to discharge the bias voltage from switching circuitry 516.

In FIG. 5, opto-isolator circuitry 540 includes an isolation barrier that includes the isolation barrier of isolated power supply 542 as a first isolation barrier portion and the isolation barrier of isolated driver 544 as a second isolation barrier portion. In some embodiments, the isolation barrier portions of opto-isolator circuitry 540 may be aligned with one another along a common isolation barrier, which may be formed in a PCB having opto-isolator circuitry 540 disposed thereon. It should be appreciated, however, that the isolation barriers of isolated power supply 542 and/or isolated driver 544 could be configured differently and still be portions of the isolation barrier of opto-isolator circuitry 540.

In some embodiments, control signal 560a may be configured to control isolated power supply 542 to provide a bias voltage to switching circuitry 516, and control signal 560b may be configured to control isolated driver 544 to discharge the bias voltage from switching circuitry 544. For example, control signal 560a may be configured to provide a constant current to isolated power supply 542, resulting in a constant bias voltage output from isolated power supply 542 sufficient to cause switching circuitry 516 to enter a conductive state, and control signal 560a may be configured to control isolated driver 544 to periodically discharge the bias voltage from switching circuitry 516, thereby controlling switching circuitry 516 to a non-conductive state. In this example, control signal 560a may be configured as a constant current signal and control signal 560b may be configured as a periodic signal, such as a square wave signal.

Alternatively or additionally, in some embodiments, control signals 560a and 560b may be configured to alternately charge switching circuitry 516 with a bias voltage and discharge the bias voltage from switching circuitry 516, such that first and second switches $Q_1$ and $Q_2$ become conductive when charged with the bias voltage and nonconductive when the bias voltage is discharged, or vice versa. For example, control signals 560a and 560b may be inverted versions of one another, such that when isolated power supply 542 stops providing the bias voltage to switching circuitry 516, isolated driver 544 begins discharging the bias voltage from switching circuitry 516. In some embodiments, control signals 560a and 560b may be square waves having a same frequency and inverted duty cycles, such that control signal 560a is high when control signal 560b is low and vice versa. In some embodiments, 560a and 560b may be sinusoidal or triangle waves that are 180 degrees out of phase from one another. It should be appreciated that any suitable control signals may be used in any embodiments described herein.

The inventors have recognized that some isolated power supplies, such as PVIs, may not be able to control switching circuitry fast enough for some applications. For example, a PVI may not be capable of quickly discharging the gate capacitance of some FETs as required in some applications. To address this problem, opto-isolator circuitry 540 includes isolated driver 544, which may be configured to control switching circuitry 516 faster than isolated power supply 542 alone. For example, isolated driver 544 can discharge the bias voltage from switching circuitry 516 faster than isolated power supply 542, making opto-isolator circuitry 540 suitable for more applications than without isolated driver 544. For example, in some embodiments, opto-isolator circuitry 540 including isolated driver 544 may be configured to change the state of switching circuitry 516 in less than 100 μs, such as less than 50 μs, less than 10 μs, and/or less than 5 μs.

In some embodiments, isolated power supply 542 and isolated driver 544 may each have their own isolation barriers. In some embodiments, isolated power supply 542 and isolated driver 544 may be positioned on a PCB having a common isolation barrier. For example, the isolation barriers of isolated power supply 542 and isolated driver 544 may be aligned with the common isolation barrier of the PCB. It should be appreciated that the isolation barriers of isolated power supply 542 and isolated driver 544 may be considered a single isolation barrier even without a common isolation barrier formed on a PCB supporting isolated power supply 542 and isolated driver 544.

Figure 6A:
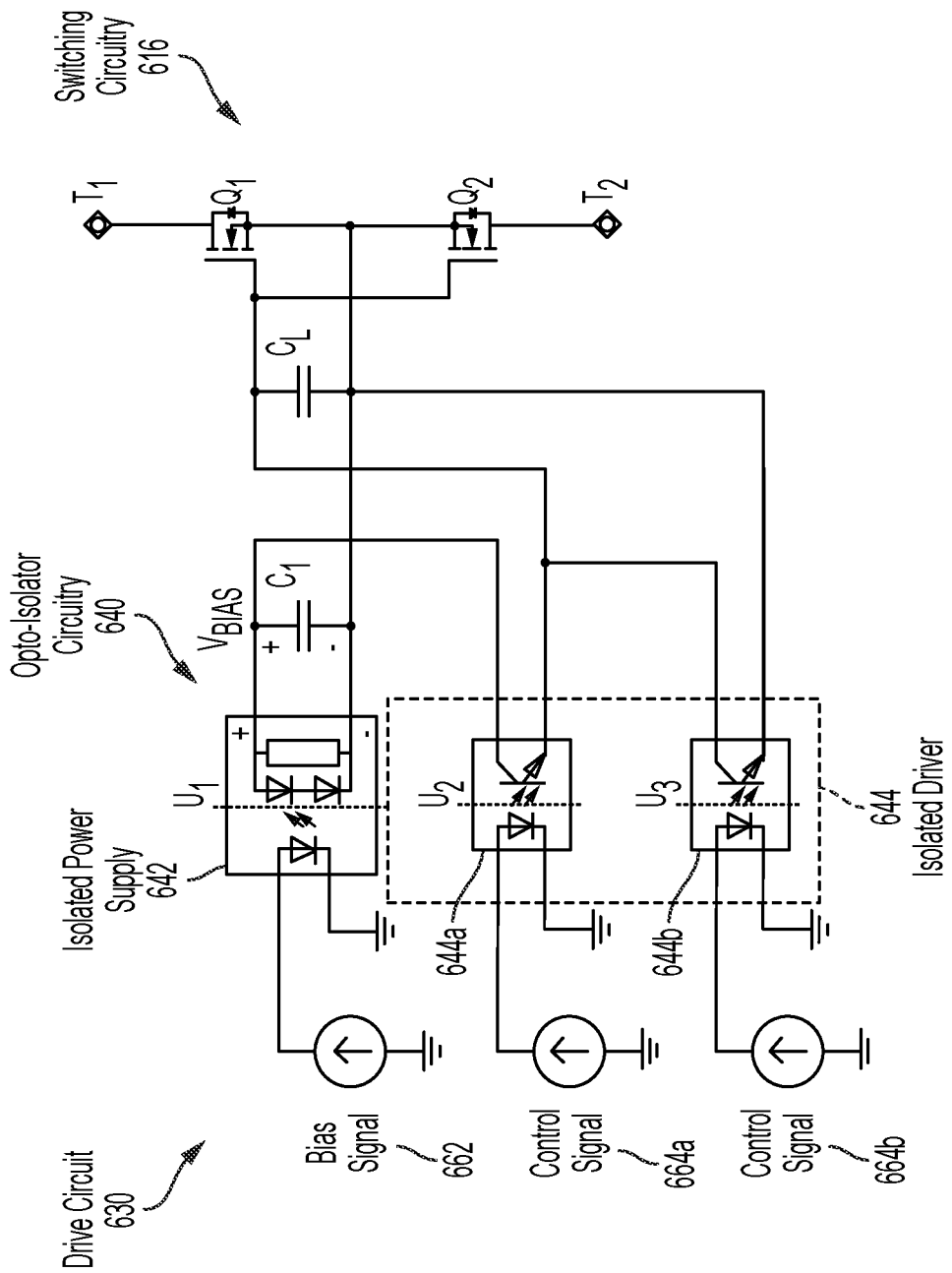
FIG. 6A is a drawing of an illustrative drive circuit 630 and switching circuitry 616, the drive circuit 630 including alternative opto-isolator circuitry 640 configured to control the switching circuitry 616, in accordance with some embodiments of the technology described herein.

FIG. 6A is a drawing of an illustrative drive circuit 630 and switching circuitry 616, the drive circuit 630 including alternative opto-isolator circuitry 640 configured to control the switching circuitry 616, in accordance with some embodiments of the technology described herein. As shown in FIG. 6A, switching circuitry 616 may be configured in the manner described herein for switching circuitry 516 including in connection with FIG. 5. In FIG. 6A, opto-isolator circuitry 640 includes isolated power supply 642, a bypass capacitor $C_1$ coupled between the outputs of isolated power supply 642, and isolated driver 644 coupled between capacitor $C_1$ and switching circuitry 616. In FIG. 6A, drive circuit 630 may be configured to control switching circuitry 616 based on bias signal 662 and control signals 664a and 664b, which may be received from and/or based on signals received from a controller (e.g., controller 306).

In some embodiments, isolated power supply 642 may be configured to maintain a bias voltage $V_{BIAS}$ across capacitor $C_1$. As shown in FIG. 6A, the LED of isolated power supply 642 may be configured to receive bias signal 662 on the first side of the isolation barrier and transmit a light signal to the photodiodes on the second side of the isolation barrier to generate the bias voltage $V_{BIAS}$. Additionally, in FIG. 6A, the outputs of isolated power supply 642 are coupled to the terminals of capacitor $C_1$. In some embodiments, bias signal 662 may be a constant current signal that causes isolated power supply 642 to maintain the bias voltage $V_{BIAS}$ as a constant voltage across capacitor $C_1$.

In some embodiments, isolated driver 644 may be configured to control switching circuitry 616 using the bias voltage $V_{BIAS}$ across capacitor $C_1$. As shown in FIG. 6A, isolated driver 644 includes first phototransistor 644a coupled between capacitor $C_1$ and the control terminals of first and second switches $Q_1$ and $Q_2$. For example, first phototransistor 644a may be configured to couple the bias voltage $V_{BIAS}$ from capacitor $C_1$ to the control terminals of first and second switches $Q_1$ and $Q_2$ when first phototransistor 644a is conductive. In this example, first phototransistor 644a may become conductive or nonconductive in response to receiving control signal 664a. In some embodiments, first phototransistor 644a may be configured to control first and second switches Q1 and Q2 to a conductive state by applying the bias voltage $V_{BIAS}$ from capacitor $C_1$ to the control terminals when first phototransistor 644a is conductive.

Also shown in FIG. 6A, isolated driver 644 includes second phototransistor 644b coupled between the control terminals and source terminals of first and second switches $Q_1$ and $Q_2$. For example, second phototransistor 644b may be configured to couple the control terminals to the source terminals of first and second switches $Q_1$ and $Q_2$ when second phototransistor 644b is conductive. In this example, second phototransistor 644b may become conductive or nonconductive in response to receiving control signal 664b. In some embodiments, second phototransistor 644b may be configured to control first and second switches $Q_1$ and $Q_2$ to a nonconductive state by coupling the control terminals to the source terminals when second phototransistor 644b is conductive.

In some embodiments, isolated driver 644 may be configured to draw more than 10 μA from capacitor $C_1$ to charge the gate capacitance of switching circuitry 616, which may be more current than could be drawn from isolated power supply 642 without capacitor $C_1$. In some embodiments, isolated driver 644 may be configured to draw less than 10 μA of quiescent current from isolated power supply 642. For example, isolated driver 644 may be configured to draw no more than 10 μA from isolated power supply 642 on average, such that isolated power supply 642 is configured to maintain the bias voltage across capacitor $C_1$ even as isolated driver 644 draws high peak current to charge the gate capacitance of switching circuitry 616. Alternatively or additionally, in some embodiments, opto-isolator circuitry 640 including isolated driver 644 may be configured to change a state of switching circuitry 616 much faster than opto-isolator circuitry 640 including only isolated power supply 642. For example, in some embodiments, opto-isolator circuitry 640 may be configured to change the state of switching circuitry 616 in less than 100 μs, such as less than 50 μs, less than 10 μs, and/or less than 5 μs. Thus, opto-isolator circuitry 640 including isolated driver 644 may be suitable for use in more applications than if only isolated power supply 642 were included in opto-isolator circuitry 640.

Figure 6B:
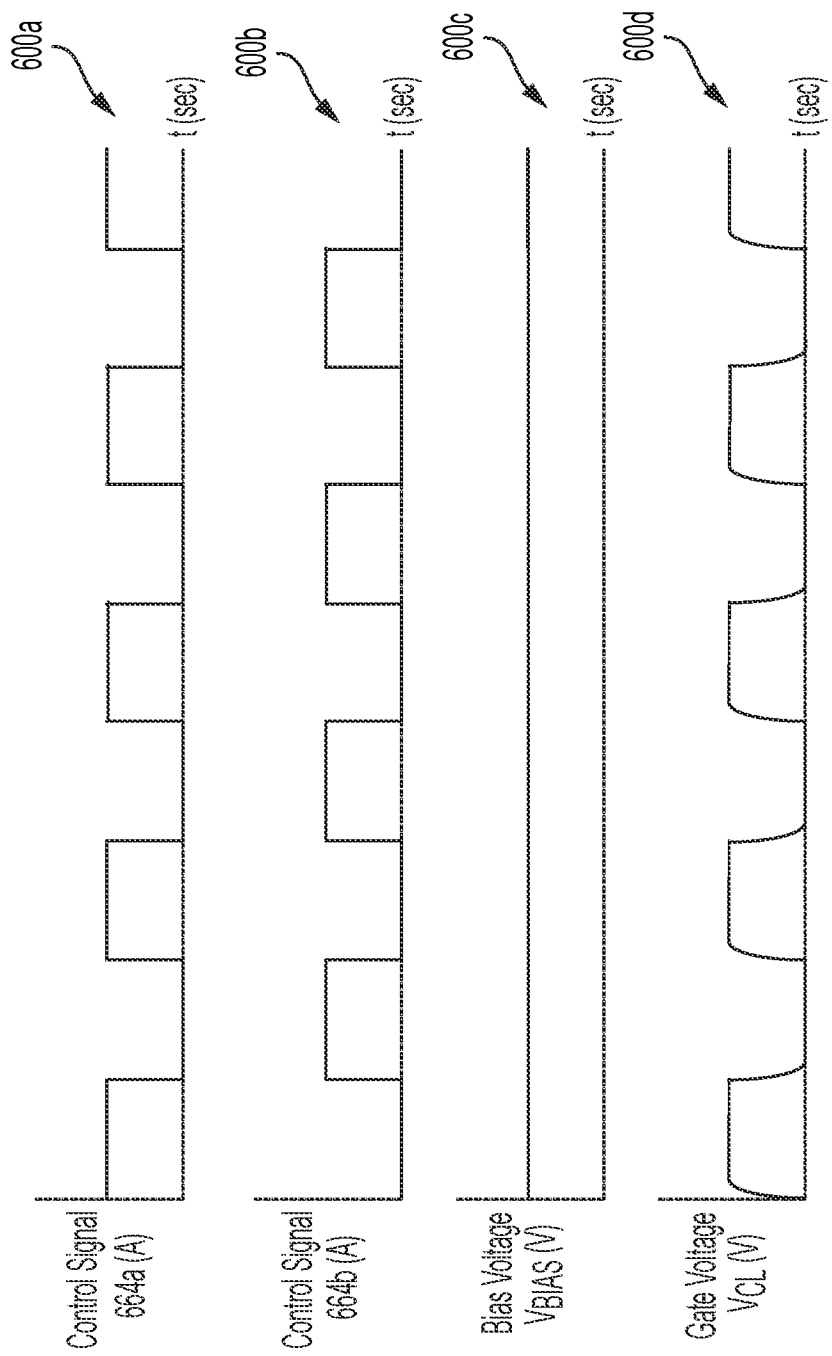
FIG. 6B is a drawing of illustrative electrical signals 664a, 664b, $V_{BIAS}$, and $V_{CL}$ that may be received and generated by the opto-isolator circuitry 640 of FIG. 6A, in accordance with some embodiments of the technology described herein.

In some embodiments, control signals 664a and 664b may be configured to cause first phototransistor 644a to be conductive when second phototransistor 644b is nonconductive, and vice versa, as described further herein including with reference to FIG. 6B.

FIG. 6B is a drawing of illustrative electrical signals 664a, 664b, $V_{BIAS}$, and $V_{CL}$ that may be received and generated by the opto-isolator circuitry 640 of FIG. 6A, in accordance with some embodiments of the technology described herein. FIG. 6B shows four graphs 600a, 600b, 600c, and 600d. Graph 600a shows control signal 664a over time, graph 600b shows control signal 664b over time, graph 600c shows bias voltage $V_{BIAS}$ over time, and graph 600d shows the voltage $V_{CL}$ over time, where voltage $V_{CL}$ is the voltage at the control terminals of first and second switches $Q_1$ and $Q_2$ represented in FIG. 6A as the voltage across gate capacitance $C_L$.

In some embodiments, control signals 664a and 664b may be inverted versions of one another. As shown in graph 600a, control signal 664a may be a square wave oscillating between a low current level (e.g., 0 A) and a high current level (e.g., high enough to cause first phototransistor 644a to become conductive). Similarly, as shown in graph 600b, control signal 664b may be a square wave oscillating between a low current level and a high current level. In some embodiments, control signals 664a and 664b may oscillate between the same high and low current levels. As shown in graphs 600a and 600b, control signal 664a may have a high current level when control signal 664b has a low current level and vice versa. For example, control signal 664a may have a high enough current level to cause first phototransistor 644a to become conductive while control signal 664a has a low enough current level to cause second phototransistor 644b to become nonconductive, and vice versa.

In some embodiments, isolated power supply 642 may be configured to maintain a constant bias voltage $V_{BIAS}$ across capacitor C1 and isolated driver 644 may be configured to control switching circuitry 616 using the bias voltage $V_{BIAS}$. For example, as shown in graph 600c, bias voltage $V_{BIAS}$ may be constant over time. As shown in graph 600d, the control terminal voltage $V_{CL}$ of switching circuitry 616 may charge to a high level when control signal 664a is high and control signal 664b is low and discharge to a low level when control signal 664a is low and control signal 664b is high. For example, when control signal 664a is high enough to cause first phototransistor 644a to become conductive, first phototransistor 644a may be configured to couple the bias voltage $V_{BIAS}$ from capacitor $C_1$ to the control terminals of switching circuitry 616, thereby charging the control terminal voltage $V_{CL}$. In this example, the control terminal voltage $V_{CL}$ of switching circuitry 616 may be high enough when charged to cause switching circuitry 616 to become conductive. Similarly, in this example, when control signal 664b is high enough to cause second phototransistor 644b to become conductive, second phototransistor 644b may be configured to couple the control terminals to the source terminals of switching circuitry 616, thereby discharging the control terminal voltage $V_{CL}$ to a low level (e.g., 0 V). In this example, the control terminal voltage $V_{CL}$ may be high enough when discharged to cause switching circuitry 616 to become nonconductive.

Figure 7:
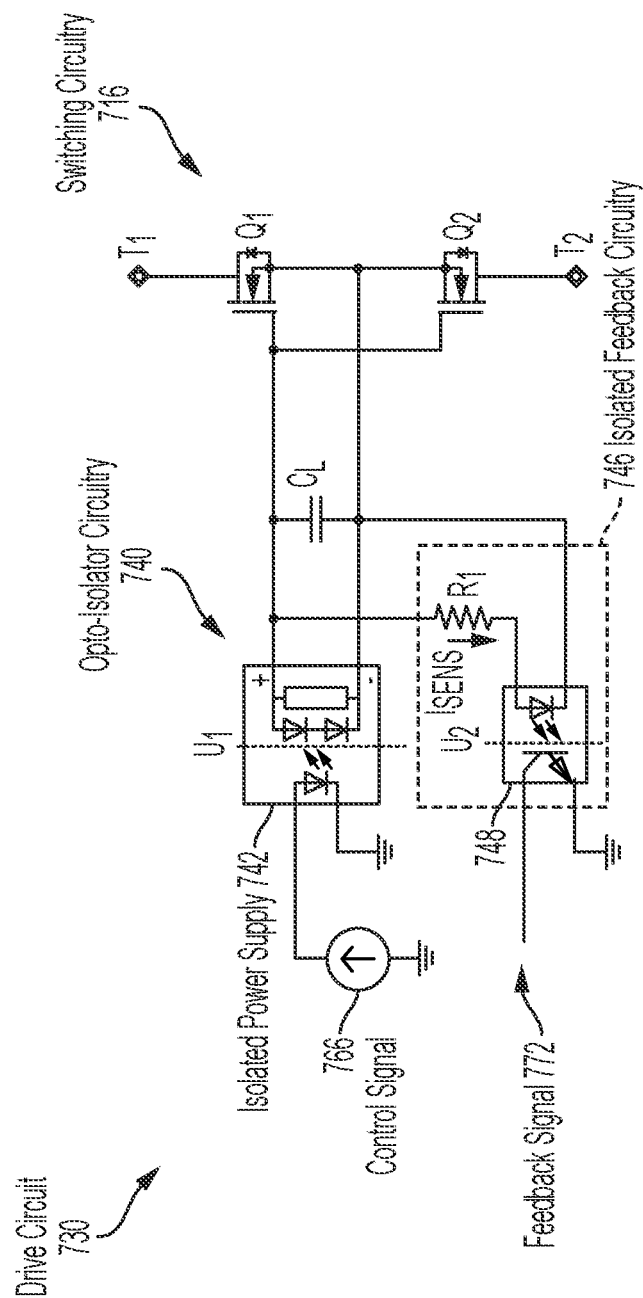
FIG. 7 is a drawing of an illustrative drive circuit 730 and switching circuitry 716, the drive circuit 730 including isolated feedback circuitry 746, in accordance with some embodiments of the technology described herein.

FIG. 7 is a drawing of illustrative drive circuit 730 and switching circuitry 716, the drive circuit 730 including isolated feedback circuitry 746, in accordance with some embodiments of the technology described herein. In some embodiments, switching circuitry 716 may be configured in the manner described herein for switching circuitry 416 including in connection with FIG. 4. In FIG. 7, opto-isolator circuitry 740 of drive circuit 730 includes isolated power supply 742, which may be configured in the manner described for isolated power supply 542 including in connection with FIG. 5, and isolated feedback circuitry 746.

In some embodiments, isolated feedback circuitry 746 may be configured to generate a feedback signal 772 on the first side of the isolation barrier based on a sense signal $I_{SENS}$ on the second side of the isolation barrier. For example, the sense signal $I_{SENS}$ may be indicative of an operating condition of opto-isolator circuitry 740 on the second side of the isolation barrier and feedback signal 772 may convey the indication of the operating condition to the first side of the isolation barrier. As shown in FIG. 7, isolated feedback circuitry 746 includes sense component $R_1$ shown as a resistor and feedback phototransistor 748. In some embodiments, sense component $R_1$ may be configured to generate the sense signal $I_{SENS}$. For example, as shown in FIG. 7, sense component $R_1$ and an LED of feedback phototransistor 748 are coupled in series, and the bias voltage provided by isolated power supply 742 is applied across sense component $R_1$ and the LED of feedback phototransistor 748. In this example, the LED of feedback phototransistor 748 may have a constant voltage across its terminals such that changes in the bias voltage result in changes to the voltage across sense component $R_1$, translating to changes in the sense signal $I_{SENS}$. As a result, the sense signal $I_{SENS}$ flowing through sense component $R_1$ and the LED of feedback phototransistor 748 may be indicative of a level of the bias voltage provided by isolated power supply 742.

In some embodiments, feedback phototransistor 748 may be configured to receive the sense signal $I_{SENS}$ on the second side of the isolation barrier and generate the feedback signal 772 on the first side of the isolation barrier based on the sense signal $I_{SENS}$. For example, in FIG. 7, the LED of feedback phototransistor 748 may be configured to transmit a light signal across the isolation barrier to cause feedback phototransistor 748 to generate feedback signal 772 as a voltage and/or current on the first side of the isolation barrier. In some embodiments, a controller (e.g., controller 306) on the first side of the isolation barrier may be configured to monitor the feedback signal 772 and adjust control signals provided to opto-isolator circuitry 740 based on feedback signal 772.

Figure 8:
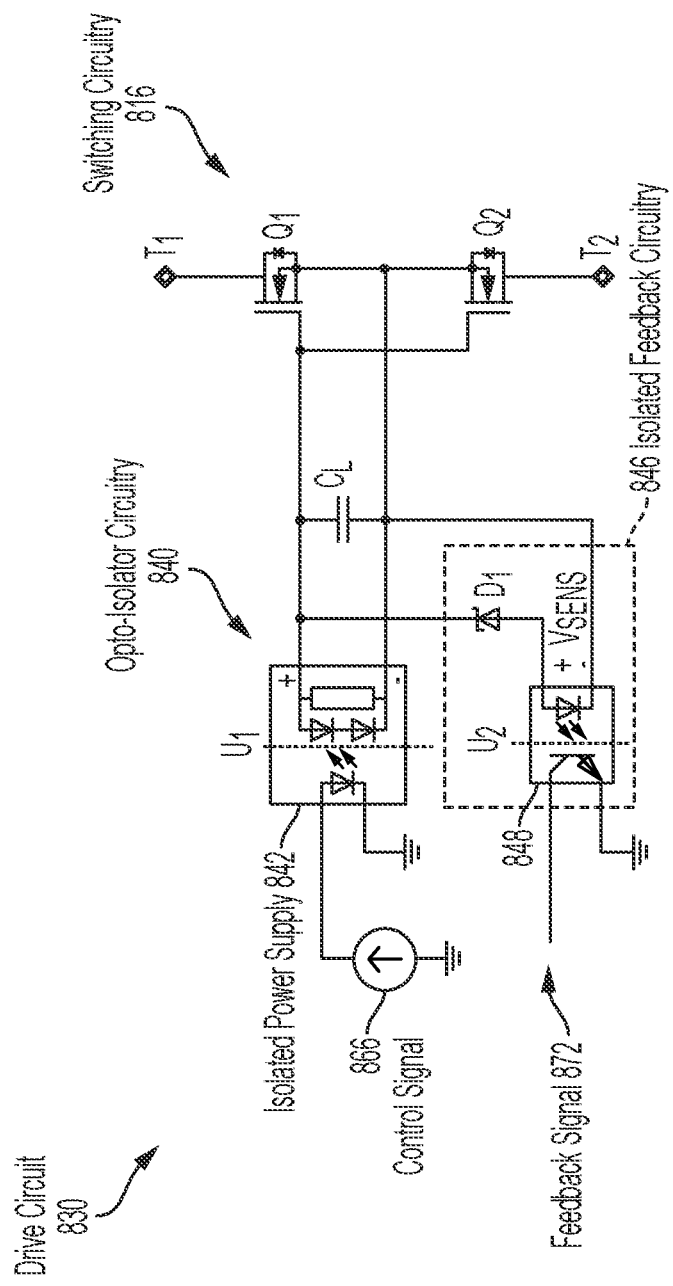
FIG. 8 is a drawing of an illustrative drive circuit 830 and switching circuitry 816, the drive circuit 830 including alternative isolated feedback circuitry 846, in accordance with some embodiments of the technology described herein.

FIG. 8 is a drawing of illustrative drive circuit 830 and switching circuitry 816, the drive circuit 830 including alternative isolated feedback circuitry 846, in accordance with some embodiments of the technology described herein. In some embodiments, switching circuitry 816 may be configured in the manner described herein for switching circuitry 416 including in connection with FIG. 4. In some embodiments, drive circuit 830 may be configured in the manner described herein for drive circuit 730 including in connection with FIG. 7. In FIG. 8, opto-isolator circuitry 840 includes isolated feedback circuitry 846 including sense component $D_1$ and feedback phototransistor 848.

In some embodiments, isolated feedback circuitry 846 may be configured to generate a feedback signal 872 on the first side of the isolation barrier based on a sense signal $V_{SENS}$ on the second side of the isolation barrier. For example, the feedback signal 872 may be indicative of an operating condition of opto-isolator circuitry 840 on the second side of the isolation barrier. In some embodiments, sense component $D_1$ may be configured to generate the sense signal $V_{SENS}$. For example, as shown in FIG. 8, sense component $D_1$ includes a Zener diode coupled in series with an LED of feedback phototransistor 848 with the voltage $V_{SENS}$ generated across the terminals of the LED, and the bias voltage provided by isolated power supply 842 is applied across sense component $D_1$ and the LED of feedback phototransistor 848. In some embodiments, sense component $D_1$ may be configured to maintain a constant voltage across its terminals. For example, the constant voltage across sense component $D_1$ can be selected based on and/or equal to an expected voltage level of the bias voltage generated by the isolated power supply 842. In this example, when the bias voltage generated by the isolated power supply 842 is equal to the constant voltage across sense component $D_1$, the sense signal $V_{SENS}$ across the LED of feedback phototransistor 848 may be small enough that the LED does not transmit a light signal across the isolation barrier. On the other hand, in this example, when the bias voltage generated by the isolated power supply 842 exceeds the constant voltage across sense component $D_1$ by a threshold level, the voltage across the LED of feedback phototransistor may be high enough to transmit a light signal across the isolation barrier, thereby generating feedback signal 872 indicating that the threshold has been exceeded.

Figure 9:
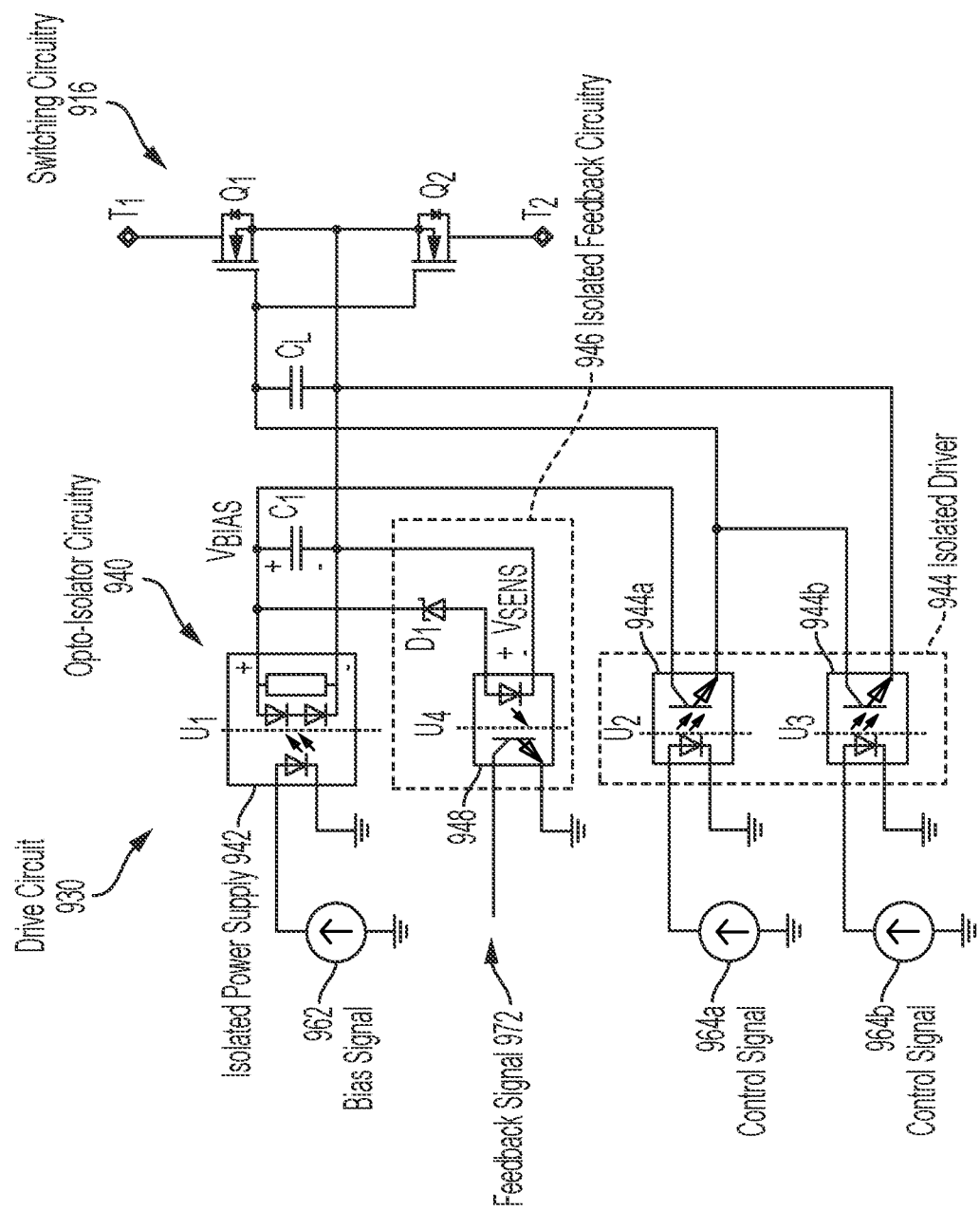
FIG. 9 is a drawing of an illustrative drive circuit 930 and switching circuitry 916, the drive circuit 930 including an isolated power supply 942, an isolated driver 944, and isolated feedback circuitry 946, in accordance with some embodiments of the technology described herein.

FIG. 9 is a drawing of illustrative drive circuit 930 and switching circuitry 916, the drive circuit 930 including an isolated power supply 942, an isolated driver 944, and isolated feedback circuitry 946, in accordance with some embodiments of the technology described herein. In some embodiments, switching circuitry 916 may be configured in the manner described herein for switching circuitry 416 including in connection with FIG. 4. In some embodiments, isolated power supply 942 and isolated driver 944 may be configured in the manner described herein for isolated power supply 642 and isolated driver 644 including in connection with FIGS. 6A and 6B. In some embodiments, feedback circuitry 946 may be configured in the manner described herein for feedback circuitry 846 including in connection with FIG. 8. It should be appreciated that the sense component of feedback circuitry 946 may alternatively or additionally include a resistor configured in the manner described herein for sense component $R_1$ including in connection with FIG. 7.

Having thus described several aspects and embodiments of the technology set forth in the disclosure, it is to be appreciated that various alterations, modifications, and improvements will readily occur to those skilled in the art. Such alterations, modifications, and improvements are intended to be within the spirit and scope of the technology described herein. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein. Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

The above-described embodiments can be implemented in any of numerous ways.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

The terms "approximately", "substantially", and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. A drive circuit configured to drive switching circuitry configured to be coupled to a radio-frequency (RF) coil of a magnetic resonance imaging (MRI) system, the drive circuit comprising:
   opto-isolator circuitry configured to control the switching circuitry, the opto-isolator circuitry comprising a photovoltaic isolator (PVI).

2. The drive circuit of 1, wherein the opto-isolator circuitry comprises: an isolated power supply comprising the PVI and configured to receive a bias signal of the plurality of signals on the first side of an isolation barrier and generate a bias voltage on the second side of the isolation barrier based on the bias signal; and an isolated driver configured to receive a control signal of the plurality of signals on the first side of the isolation barrier and control the switching circuitry on the second side of the isolation barrier based on the control signal.

3. The drive circuit of claim 2, wherein:
   the isolated power supply comprises a first isolation barrier portion of the isolation barrier and is configured to receive the bias signal on a first side of the first isolation barrier portion and generate the bias voltage on a second side of the first isolation barrier portion; and
   the isolated driver comprises a second isolation barrier portion of the isolation barrier and is configured to receive the control signal on a first side of the second isolation barrier portion and control the switching circuitry on a second side of the second isolation barrier portion.

4. The drive circuit of claim 3, further comprising a capacitor coupled to the isolated power supply, wherein the isolated power supply is configured to maintain the bias voltage across the capacitor when the isolated driver controls the switching circuitry using the bias voltage.

5. The drive circuit of claim 2, wherein the isolated driver comprises at least one phototransistor.

6. The drive circuit of claim 5, wherein the at least one phototransistor comprises:
   a first phototransistor configured to couple the bias voltage from the isolated power supply to the switching circuitry; and
   a second phototransistor configured to discharge the bias voltage from the switching circuitry.

7. The drive circuit of claim 6, wherein the first phototransistor is configured to receive the control signal and the second phototransistor is configured to receive an inverted version of the control signal.

8. The drive circuit of claim 2, wherein the opto-isolator circuitry further comprises feedback circuitry configured to generate a feedback signal on the first side of the isolation barrier based on a sense signal on the second side of the isolation barrier, and wherein the switching circuitry is positioned on the second side of the isolation barrier.

9. The drive circuit of claim 8, wherein the feedback circuitry comprises:
   a sense component positioned on the second side of the isolation barrier and configured to generate the sense signal; and
   a feedback phototransistor configured to receive the sense signal on the second side of the isolation barrier and generate the feedback signal on the first side of the isolation barrier based on the sense signal.

10. The drive circuit of claim 9, wherein the sense component comprises a Zener diode configured to generate the sense signal based on the bias voltage generated by the isolated power supply.

11. A magnetic resonance imaging (MRI) system, comprising:
a radio-frequency (RF) coil configured to, when operated, transmit and/or receive RF signals to and/or from a field of view of the MRI system;
switching circuitry coupled to the RF transmit coil; and
a drive circuit of claim 1, wherein the opto-isolator circuitry of the drive circuit is configured to control the switching circuitry.

12. The MRI system of claim 11, wherein the RF coil comprises an RF transmit coil.

13. The drive circuit of claim 1, wherein the opto-isolator circuitry is configured to receive a plurality of signals on a first side of an isolation barrier and control the switching circuitry on a second side of the isolation barrier using each of the plurality of signals.

14. A method, comprising:
controlling switching circuitry coupled to a radio-frequency (RF) coil of a magnetic resonance imaging (MRI) system at least in part using opto-isolator circuitry that comprises a photovoltaic isolator (PVI).

15. The method of claim 14, wherein:
the opto-isolator circuitry comprises:
an isolated power supply comprising the PVI; and
an isolated driver; and
controlling the switching circuitry comprises:
receiving a bias signal at the isolated power supply on a first side of an isolation barrier and generating a bias voltage on a second side of the isolation barrier based on the bias signal; and
receiving a control signal at the isolated driver on the first side of the isolation barrier, wherein the isolated driver controls the switching circuitry on the second side of the isolation barrier based on the control signal.

16. The method of claim 15, wherein:
the isolated power supply comprises a first isolation barrier portion of the isolation barrier, receives the bias signal on a first side of the first isolation barrier portion, and generates the bias voltage on a second side of the first isolation barrier portion; and
the isolated driver comprises a second isolation barrier portion of the isolation barrier, receives the control signal on a first side of the second isolation barrier portion, and controls the switching circuitry on a second side of the second isolation barrier portion.

17. The method of claim 15, further comprising drawing, by the isolated driver, from the isolated power supply, a quiescent current of less than 10 microamperes (µA).

18. The method of claim 15, wherein controlling the switching circuitry comprises maintaining the bias voltage across a capacitor coupled to the isolated power supply when the isolated driver controls the switching circuitry using the bias voltage.

19. The method of claim 15, further comprising generating a feedback signal on the first side of the isolation barrier based on a sense signal on the second side of the isolation barrier, wherein the switching circuitry is positioned on the second side of the isolation barrier.

20. The method of claim 19, wherein generating the feedback signal comprises receiving the sense signal at a feedback phototransistor on the second side of the isolation barrier, wherein the feedback phototransistor generates the feedback signal on the first side of the isolation barrier based on the sense signal.

* * * * *